United States Patent
Lin et al.

(10) Patent No.: US 12,206,012 B2
(45) Date of Patent: Jan. 21, 2025

(54) REDUCING K VALUES OF DIELECTRIC FILMS THROUGH ANNEAL

(71) Applicant: Taiwan Semiconductor Manufacturing Co., Ltd., Hsinchu (TW)

(72) Inventors: Wen-Kai Lin, Yilan County (TW); Che-Hao Chang, Hsinchu (TW); Chi On Chui, Hsinchu (TW); Yung-Cheng Lu, Hsinchu (TW); Szu-Ying Chen, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 62 days.

(21) Appl. No.: 17/333,592

(22) Filed: May 28, 2021

(65) Prior Publication Data

US 2022/0238697 A1 Jul. 28, 2022

Related U.S. Application Data

(60) Provisional application No. 63/142,546, filed on Jan. 28, 2021.

(51) Int. Cl.
| | |
|---|---|
| *H01L 29/66* | (2006.01) |
| *H01L 21/02* | (2006.01) |
| *H01L 29/06* | (2006.01) |
| *H01L 29/40* | (2006.01) |
| *H01L 29/417* | (2006.01) |
| *H01L 29/423* | (2006.01) |

(52) U.S. Cl.
CPC .... *H01L 29/66553* (2013.01); *H01L 21/0228* (2013.01); *H01L 29/0665* (2013.01); *H01L 29/401* (2013.01); *H01L 29/41775* (2013.01); *H01L 29/42392* (2013.01); *H01L 29/66545* (2013.01)

(58) Field of Classification Search
CPC .......... H01L 29/66553; H01L 21/0228; H01L 29/0665; H01L 29/401; H01L 29/41775; H01L 29/42392; H01L 29/66545
See application file for complete search history.

(56) References Cited

U.S. PATENT DOCUMENTS

| | | | |
|---|---|---|---|
| 7,687,409 B2 * | 3/2010 | Ahn | ................... H01L 21/3142 438/763 |
| 10,868,131 B2 | 12/2020 | Yeh et al. | |
| 11,322,412 B2 | 5/2022 | Kao et al. | |
| 2015/0162185 A1 | 6/2015 | Pore | |

(Continued)

FOREIGN PATENT DOCUMENTS

| | | |
|---|---|---|
| DE | 102019116921 A1 | 1/2020 |
| KR | 20200060679 A | 6/2020 |
| TW | 202002028 A | 1/2020 |

*Primary Examiner* — Monica D Harrison
*Assistant Examiner* — Andre C Stevenson
(74) *Attorney, Agent, or Firm* — Slater Matsil, LLP

(57) ABSTRACT

A method includes performing an atomic layer deposition (ALD) process to form a dielectric layer on a wafer. The ALD process comprises an ALD cycle includes pulsing calypso ((SiCl$_3$)$_2$CH$_2$), purging the calypso, pulsing ammonia, and purging the ammonia. The method further includes performing a wet anneal process on the dielectric layer, and performing a dry anneal process on the dielectric layer.

20 Claims, 28 Drawing Sheets

(56) References Cited

U.S. PATENT DOCUMENTS

| | | | |
|---|---|---|---|
| 2016/0071757 A1* | 3/2016 | Tsai | ............... H01L 21/02164 438/400 |
| 2018/0166327 A1* | 6/2018 | Hsiao | ............ H01L 21/823431 |
| 2018/0342596 A1 | 11/2018 | Lee et al. | |
| 2019/0267463 A1 | 8/2019 | Chao et al. | |
| 2019/0280088 A1 | 9/2019 | Xu et al. | |
| 2019/0348403 A1* | 11/2019 | Mochizuki | ......... H01L 21/0245 |
| 2019/0386111 A1 | 12/2019 | Yeh et al. | |
| 2020/0006151 A1* | 1/2020 | Kao | ............... H01L 21/31111 |
| 2020/0332415 A1 | 10/2020 | Bhuyan et al. | |
| 2020/0388626 A1 | 12/2020 | Baraskar et al. | |

* cited by examiner

REDUCING K VALUES OF DIELECTRIC FILMS THROUGH ANNEAL

PRIORITY CLAIM AND CROSS-REFERENCE

This application claims the benefit of the following provisionally filed U.S. Patent application: Application No. 63/142,546, filed on Jan. 28, 2021, and entitled "New Material UK Film by Porous SiCON Material with Post Mature for K Value Below 4.0 as Inner Spacer Under GAA Develop;" which application is hereby incorporated herein by reference.

BACKGROUND

In the formation of integrated circuits such as transistors, dielectric layers often need to have high resistance to etching, so that they are not damaged when other features are etched. Accordingly, some high-k dielectric materials such as SiOCN, SiON, SiOC, SiCN, etc., are often used. The high-k materials, however, result in the increase in parasitic capacitance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
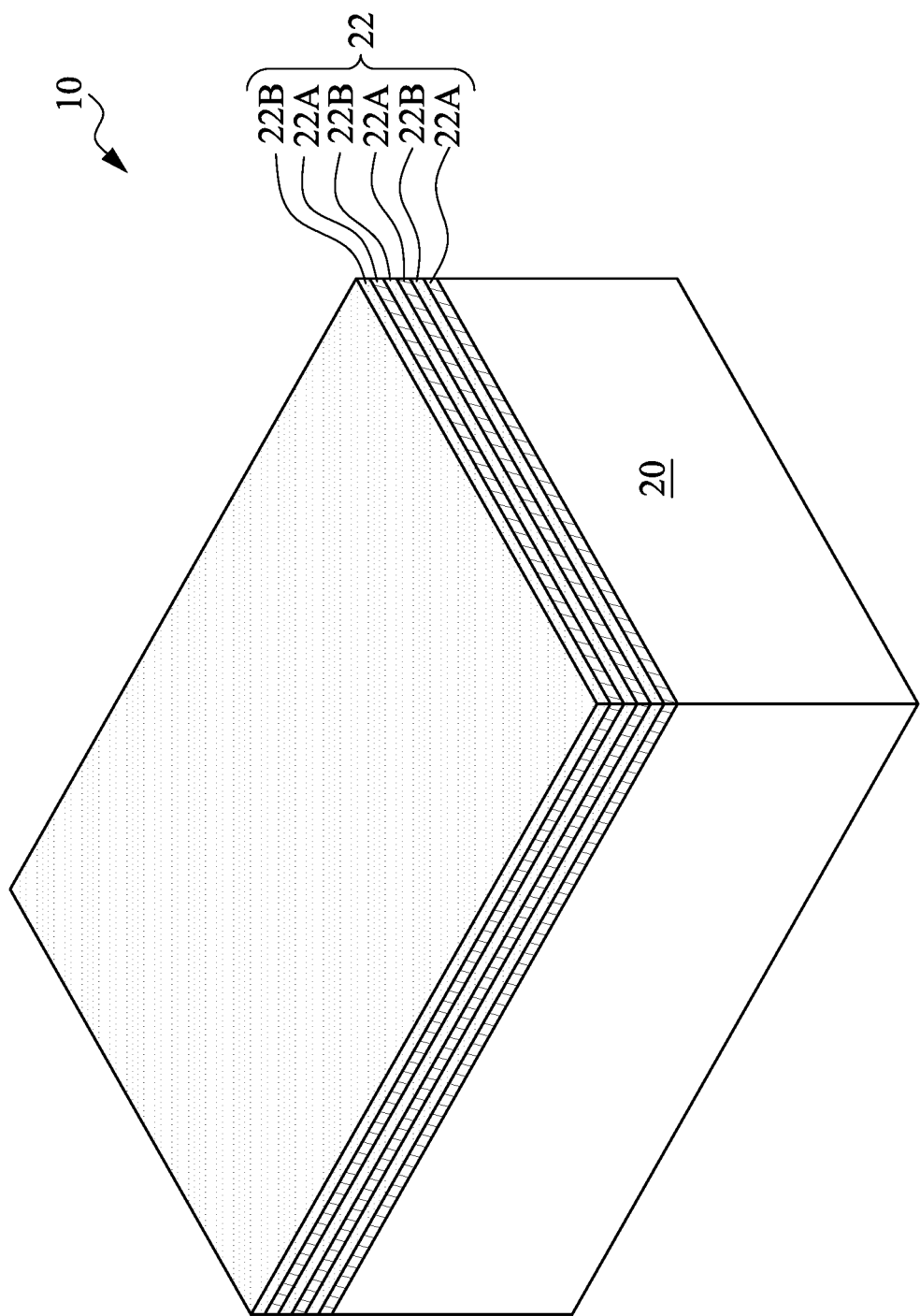
FIGS. 1-4, 5A, 5B, 6A, 6B, 7A, 7B, 8A, 8B, 9A, 9B, 9C, 10A, 10B, 11A, 11B, 11C, 12A, 12B, 13A, 13B, 14A, 14B, 15A, 15B, 16A, 16B, 17A, 17B, 17C, 18A, 18B, and 18C illustrate the cross-sectional views of intermediate stages in the formation of a Gate All-Around (GAA) transistor in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A Gate All-Around (GAA) transistor having an inner spacer with reduced k value and improved etching resistance is provided. The method of forming the GAA transistor is also provided. In accordance with some embodiments of the present disclosure, the inner spacer is formed by using calypso $((SiCl_3)_2CH_2)$ and ammonia $(NH_3)$ as precursors to deposit a dielectric film. A post-deposition maturing process is performed, which includes a wet anneal process and a dry anneal process. The resulting dielectric layer has a reduced k value, and improved etching resistance to the subsequent etching and cleaning processes. The dielectric film may also be used to form other features such as gate spacers. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

Figure 24:
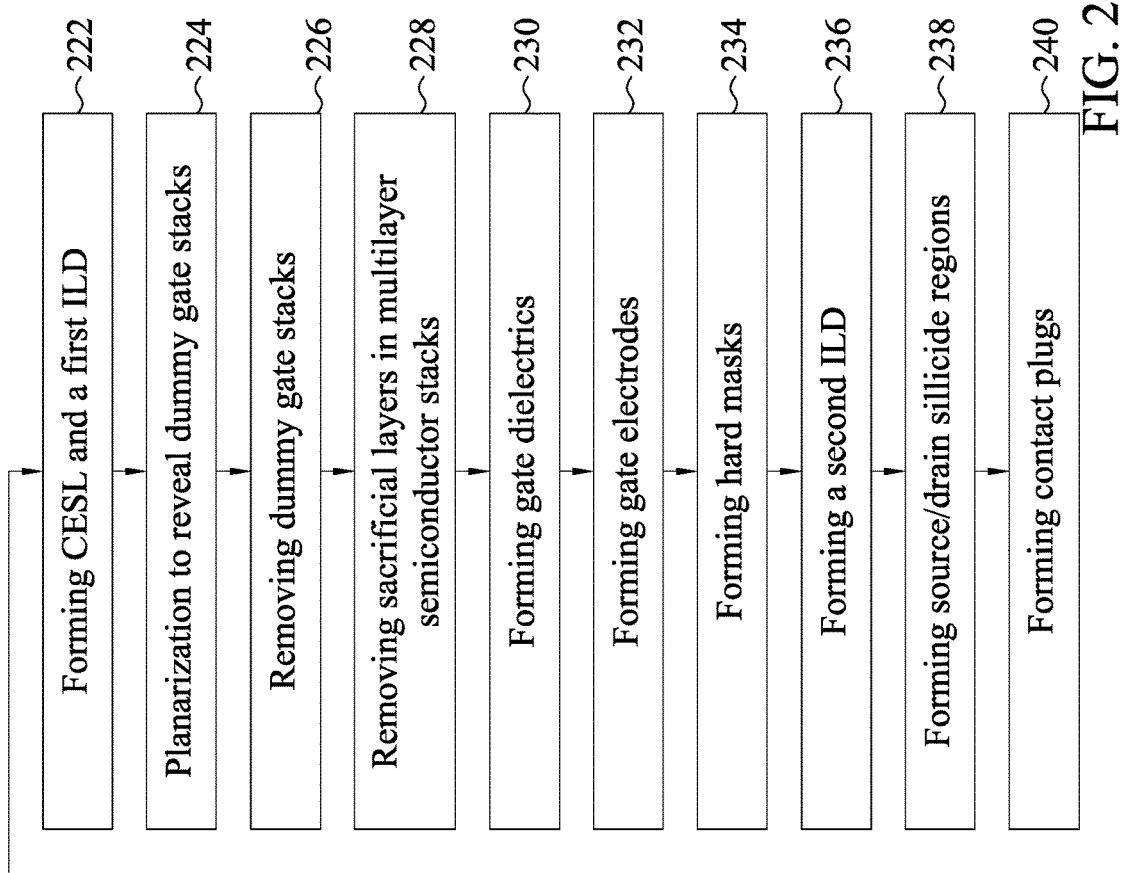
FIG. 24 illustrates a process flow for forming a GAA transistor in accordance with some embodiments.
Figure 24:
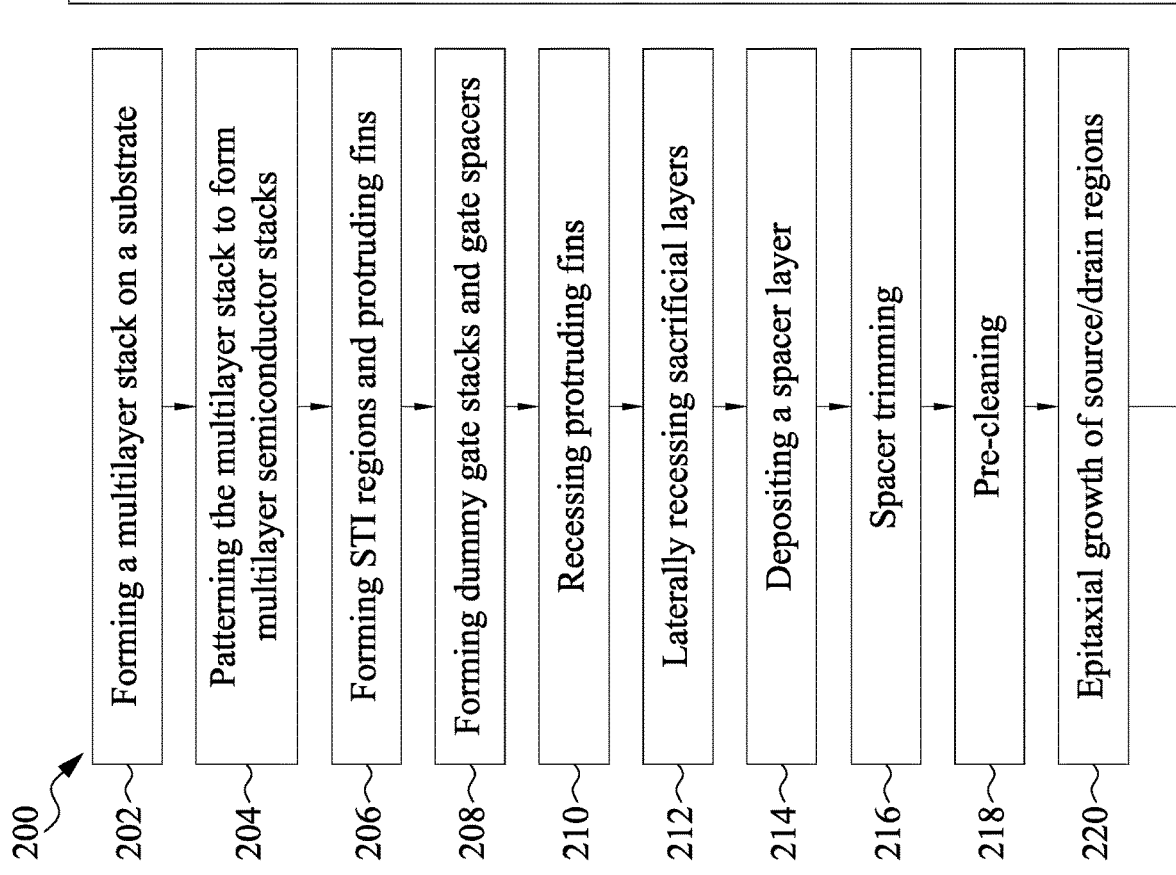

FIGS. 1-4, 5A, 5B, 6A, 6B, 7A, 7B, 8A, 8B, 9A, 9B, 9C, 10A, 10B, 11A, 11B, 11C, 12A, 12B, 13A, 13B, 14A, 14B, 15A, 15B, 16A, 16B, 17A, 17B, 17C, 18A, 18B, and 18C illustrate the cross-sectional views of intermediate stages in the formation of a GAA transistor in accordance with some embodiments of the present disclosure. The corresponding processes are also reflected schematically in the process flow shown in FIG. 24.

Referring to FIG. 1, a perspective view of wafer 10 is shown. Wafer 10 includes a multilayer structure comprising multilayer stack 22 on substrate 20. In accordance with some embodiments, substrate 20 is a semiconductor substrate, which may be a silicon substrate, a silicon germanium (SiGe) substrate, or the like, while other substrates and/or structures, such as semiconductor-on-insulator (SOI), strained SOI, silicon germanium on insulator, or the like, could be used. Substrate 20 may be doped as a p-type semiconductor, although in other embodiments, it may be doped as an n-type semiconductor.

In accordance with some embodiments, multilayer stack 22 is formed through a series of deposition processes for depositing alternating materials. The respective process is illustrated as process 202 in the process flow 200 shown in FIG. 24. In accordance with some embodiments, multilayer stack 22 comprises first layers 22A formed of a first semiconductor material and second layers 22B formed of a second semiconductor material different from the first semiconductor material.

In accordance with some embodiments, the first semiconductor material of a first layer 22A is formed of or comprises SiGe, Ge, Si, GaAs, InSb, GaSb, InAlAs, InGaAs, GaSbP, GaAsSb, or the like. In accordance with some embodiments, the deposition of first layers 22A (for example, SiGe) is through epitaxial growth, and the corresponding deposition method may be Vapor-Phase Epitaxy (VPE), Molecular Beam Epitaxy (MBE), Chemical Vapor deposition (CVD), Low Pressure CVD (LPCVD), Atomic Layer Deposition (ALD), Ultra High Vacuum CVD (UHVCVD), Reduced Pressure CVD (RPCVD), or the like. In accordance with some embodiments, the first layer 22A is formed to a first thickness in the range between about 30 Å and about 300 Å. However, any suitable thickness may be utilized while remaining within the scope of the embodiments.

Once the first layer 22A has been deposited over substrate 20, a second layer 22B is deposited over the first layer 22A. In accordance with some embodiments, the second layers 22B is formed of or comprises a second semiconductor material such as Si, SiGe, Ge, GaAs, InSb, GaSb, InAlAs, InGaAs, GaSbP, GaAsSb, combinations of these, or the like, with the second semiconductor material being different from the first semiconductor material of first layer 22A. For example, in accordance with some embodiments the first layer 22A is silicon germanium, the second layer 22B may be formed of silicon, or vice versa. It is appreciated that any suitable combination of materials may be utilized for first layers 22A and the second layers 22B.

In accordance with some embodiments, the second layer 22B is epitaxially grown on the first layer 22A using a deposition technique similar to that is used to form the first layer 22A. In accordance with some embodiments, the second layer 22B is formed to a similar thickness to that of the first layer 22A. The second layer 22B may also be formed to a thickness that is different from the first layer 22A. In accordance with some embodiments, the second layer 22B may be formed to a second thickness in the range between about 10 Å and about 500 Å, for example.

Once the second layer 22B has been formed over the first layer 22A, the deposition process is repeated to form the remaining layers in multilayer stack 22, until a desired topmost layer of multilayer stack 22 has been formed. In accordance with some embodiments, first layers 22A have thicknesses the same as or similar to each other, and second layers 22B have thicknesses the same as or similar to each other. First layers 22A may also have the same thicknesses as, or different thicknesses from, that of second layers 22B. In accordance with some embodiments, first layers 22A are removed in the subsequent processes, and are alternatively referred to as sacrificial layers 22A throughout the description. In accordance with alternative embodiments, second layers 22B are sacrificial, and are removed in the subsequent processes.

In accordance with some embodiments, there are some pad oxide layer(s) and hard mask layer(s) (not shown) formed over multilayer stack 22. These layers are patterned, and are used for the subsequent patterning of multilayer stack 22.

Figure 2:
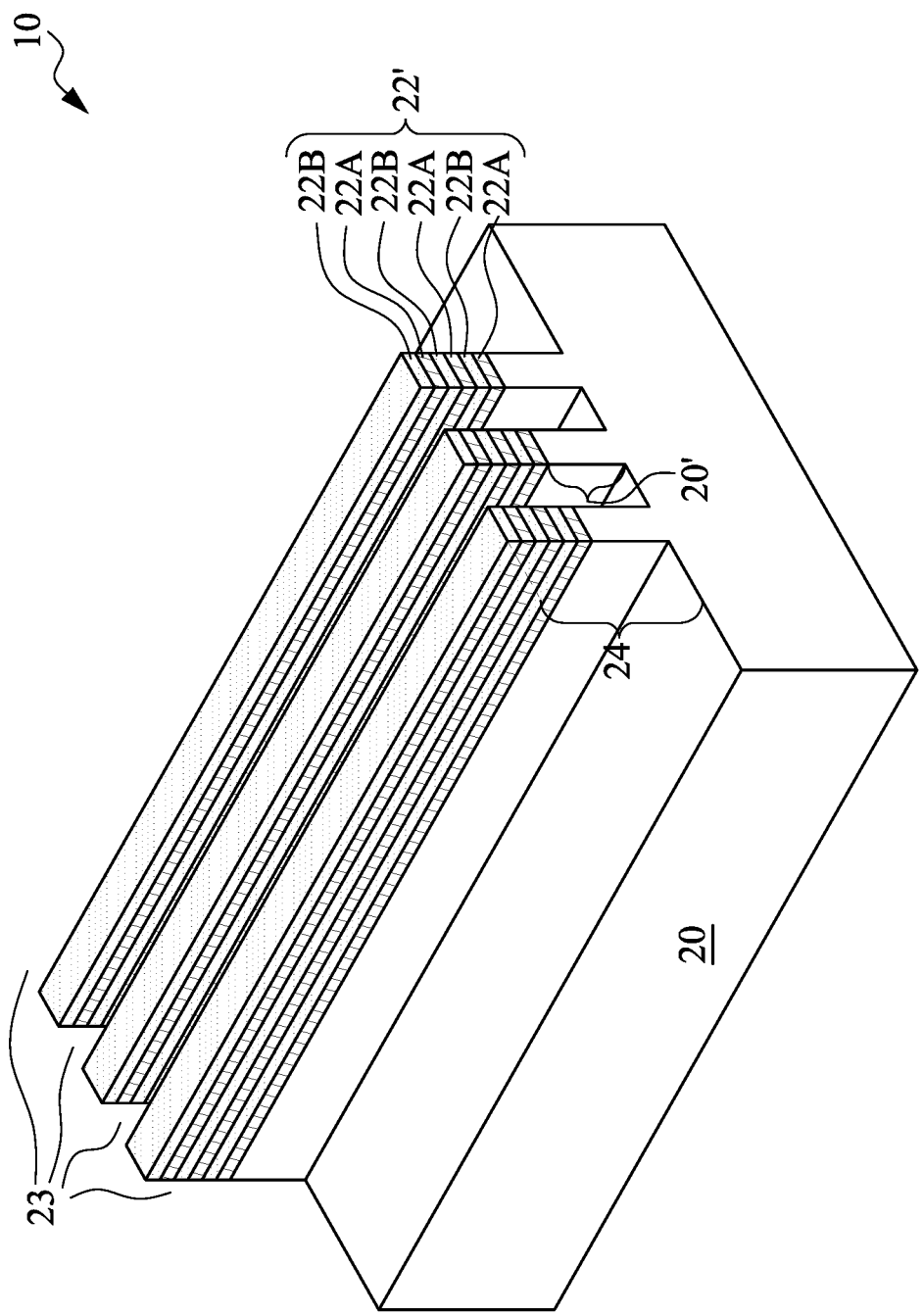

Referring to FIG. 2, multilayer stack 22 and a portion of the underlying substrate 20 are patterned in an etching process(es), so that trenches 23 are formed. The respective process is illustrated as process 204 in the process flow 200 shown in FIG. 24. Trenches 23 extend into substrate 20. The remaining portions of multilayer stacks are referred to as multilayer stacks 22' hereinafter. Underlying multilayer stacks 22', some portions of substrate 20 are left, and are referred to as substrate strips 20' hereinafter. Multilayer stacks 22' include semiconductor layers 22A and 22B. Semiconductor layers 22A are alternatively referred to as sacrificial layers, and Semiconductor layers 22B are alternatively referred to as nanostructures hereinafter. The portions of multilayer stacks 22' and the underlying substrate strips 20' are collectively referred to as semiconductor strips 24.

In above-illustrated embodiments, the GAA transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Figure 3:
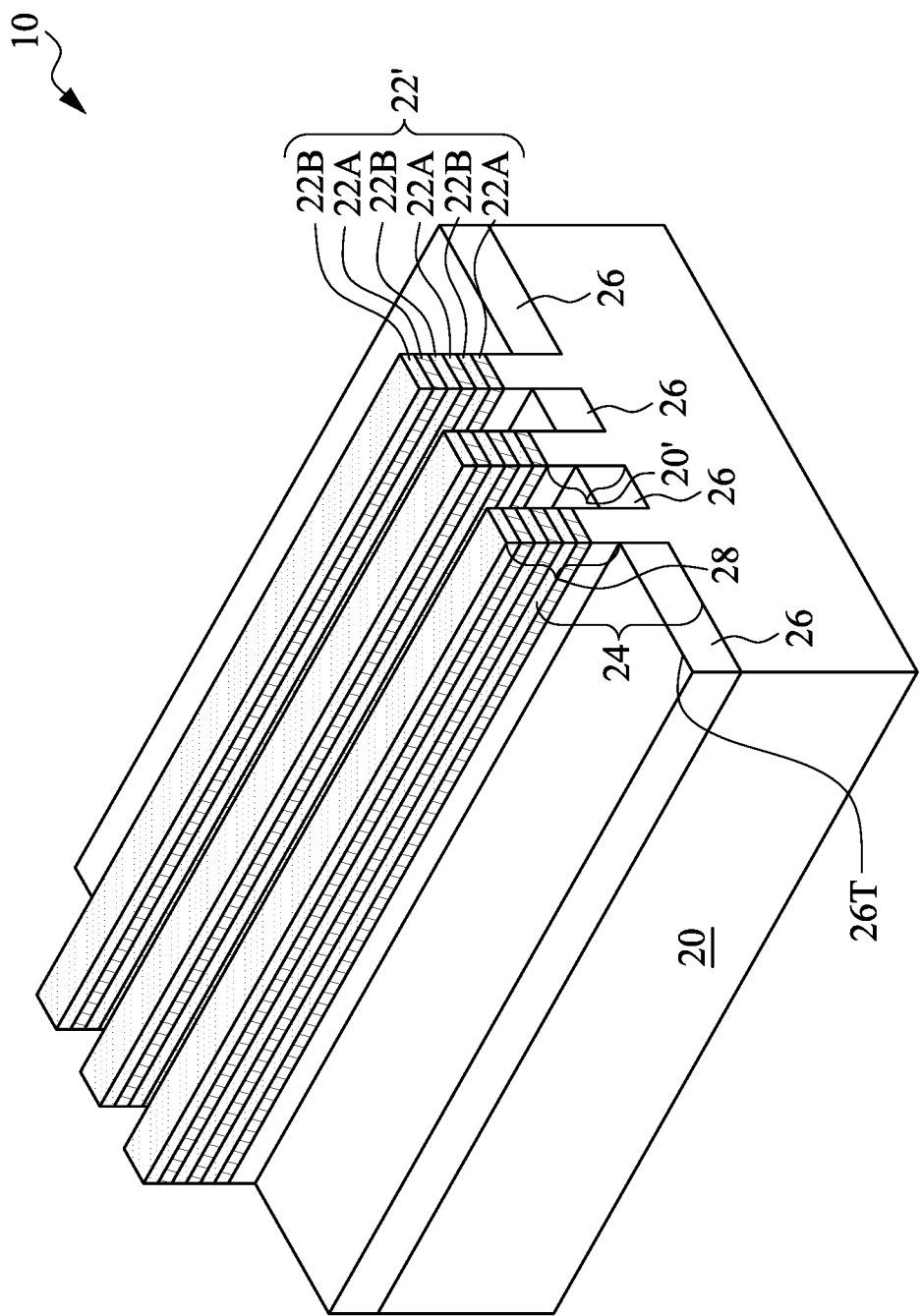

FIG. 3 illustrates the formation of isolation regions 26, which are also referred to as Shallow Trench Isolation (STI) regions throughout the description. The respective process is illustrated as process 206 in the process flow 200 shown in FIG. 24. STI regions 26 may include a liner oxide (not shown), which may be a thermal oxide formed through the thermal oxidation of a surface layer of substrate 20. The liner oxide may also be a deposited silicon oxide layer formed using, for example, ALD, High-Density Plasma Chemical Vapor Deposition (HDPCVD), CVD, or the like. STI regions 26 may also include a dielectric material over the liner oxide, wherein the dielectric material may be formed using Flowable Chemical Vapor Deposition (FCVD), spin-on coating, HDPCVD, or the like. A planarization process such as a Chemical Mechanical Polish (CMP) process or a mechanical grinding process may then be performed to level the top surface of the dielectric material, and the remaining portions of the dielectric material are STI regions 26.

STI regions 26 are then recessed, so that the top portions of semiconductor strips 24 protrude higher than the top surfaces 26T of the remaining portions of STI regions 26 to form protruding fins 28. Protruding fins 28 include multi-layer stacks 22' and the top portions of substrate strips 20'. The recessing of STI regions 26 may be performed through a dry etching process, wherein $NF_3$ and $NH_3$, for example, are used as the etching gases. During the etching process, plasma may be generated. Argon may also be included. In accordance with alternative embodiments of the present disclosure, the recessing of STI regions 26 is performed through a wet etching process. The etching chemical may include HF, for example.

Figure 4:
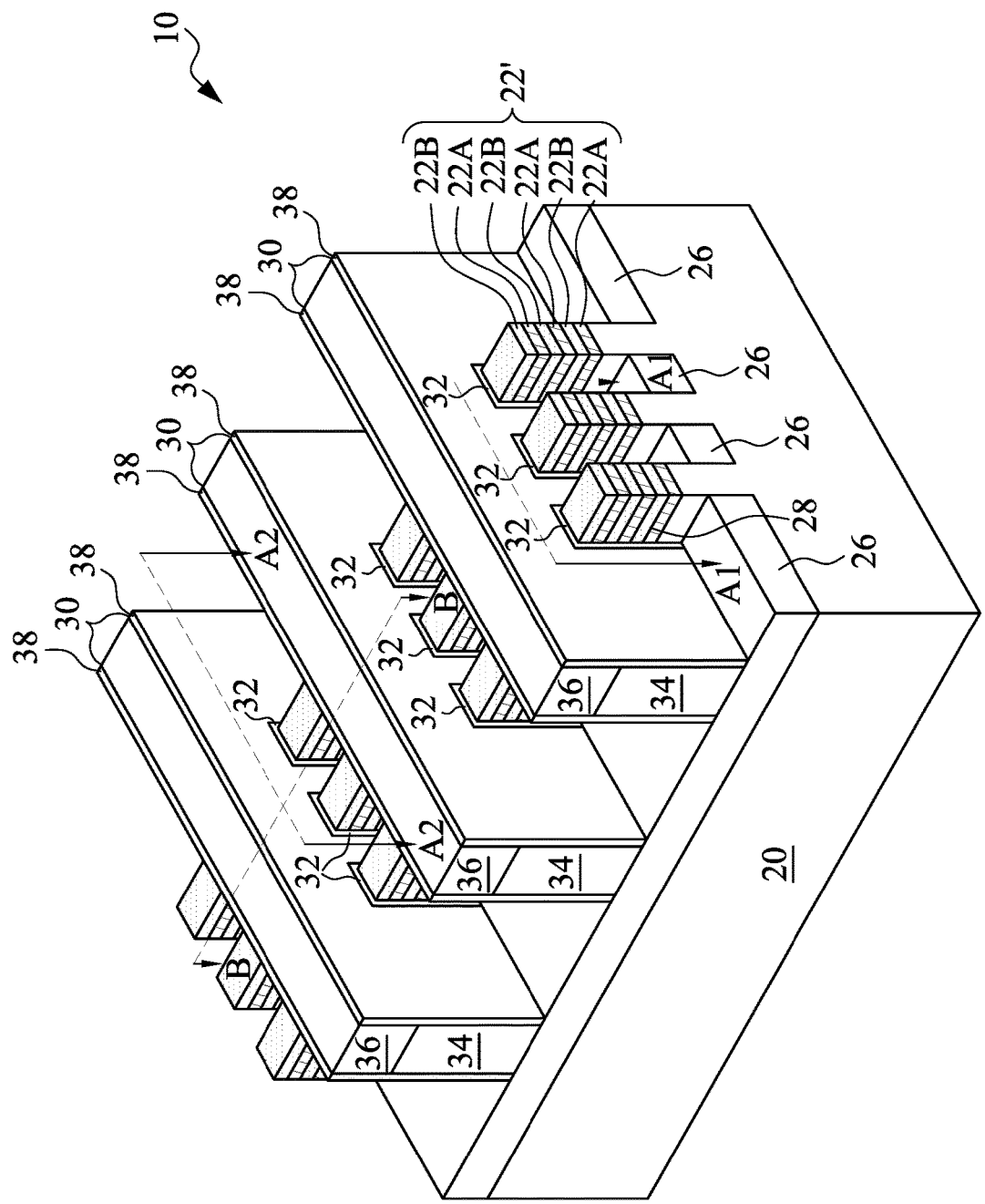

Referring to FIG. 4, dummy gate stacks 30 and gate spacers 38 are formed on the top surfaces and the sidewalls of (protruding) fins 28. The respective process is illustrated as process 208 in the process flow 200 shown in FIG. 24. Dummy gate stacks 30 may include dummy gate dielectrics 32 and dummy gate electrodes 34 over dummy gate dielectrics 32. Dummy gate dielectrics 32 may be formed by oxidizing the surface portions of protruding fins 28 to form oxide layers, or by depositing a dielectric layer such as a silicon oxide layer. Dummy gate electrodes 34 may be formed, for example, using polysilicon or amorphous silicon, and other materials such as amorphous carbon may also be used. Each of dummy gate stacks 30 may also include one (or a plurality of) hard mask layer 36 over dummy gate electrode 34. Hard mask layers 36 may be formed of silicon nitride, silicon oxide, silicon carbo-nitride, silicon oxy-carbo nitride, or multilayers thereof. Dummy gate stacks 30 may cross over a single one or a plurality of protruding fins 28 and the STI regions 26 between protruding fins 28. Dummy gate stacks 30 also have lengthwise directions perpendicular to the lengthwise directions of protruding fins 28. The formation of dummy gate stacks 30 includes forming a dummy gate dielectric layer, depositing a dummy gate electrode layer over the dummy gate dielectric layer, depositing one or more hard mask layers, and then patterning the formed layers through a patterning process(es).

Next, gate spacers 38 are formed on the sidewalls of dummy gate stacks 30. In accordance with some embodiments of the present disclosure, gate spacers 38 are formed of a dielectric material such as silicon nitride (SiN), silicon oxide ($SiO_2$), silicon carbo-nitride (SiCN), silicon oxynitride (SiON), silicon oxy-carbo-nitride (SiOCN), or the like, and may have a single-layer structure or a multilayer structure including a plurality of dielectric layers. The formation process of gate spacers 38 may include depositing one or a plurality of dielectric layers, and then performing an anisotropic etching process(es) on the dielectric layer(s). The remaining portions of the dielectric layer(s) are gate spacers 38.

Figure 19:
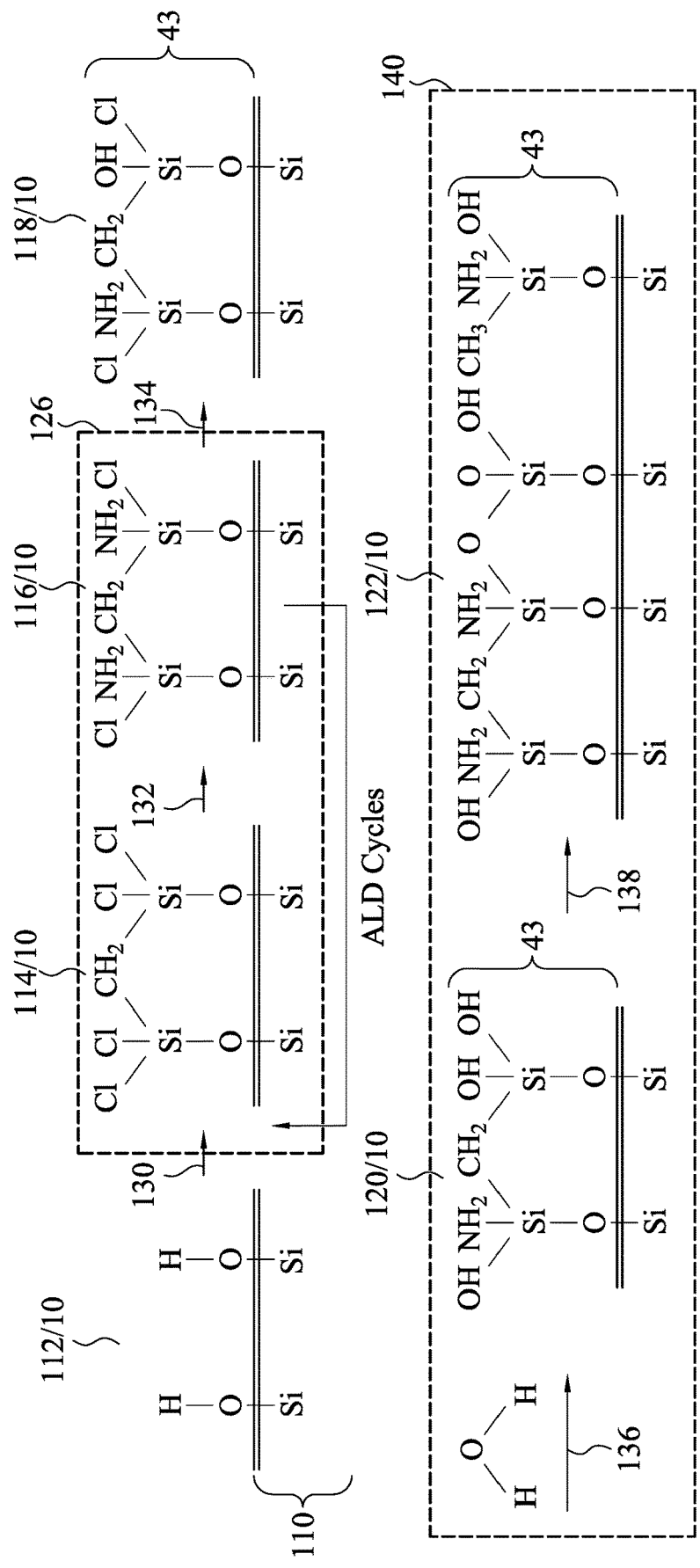
FIG. 19 illustrates Atomic Layer Deposition (ALD) cycles and anneal processes in the formation of a SiOCN film in accordance with some embodiments.
Figure 20:
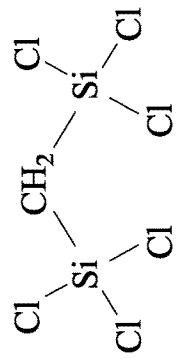
FIG. 20 illustrates a chemical structure of calypso in accordance with some embodiments.
Figure 21:
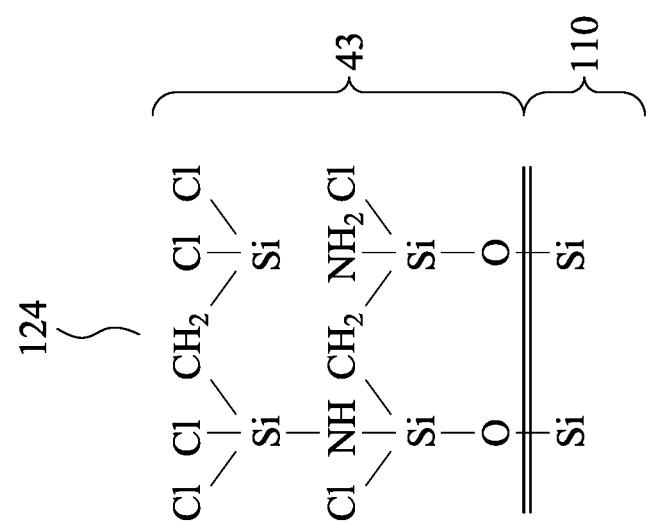
FIG. 21 illustrates the chemical structure formed by two ALD cycles in accordance with some embodiments.

In accordance with alternative embodiments, one or more layers of gate spacers 38 may be formed using the processes as illustrated in FIG. 19, and the resulting layer of gate spacers 38 comprises the material as discussed referring to FIGS. 19 through 21. For example, gate spacers 38 may be formed of or include SiOCNH therein. The details of the formation processes are discussed in subsequent paragraphs.

Figure 5B:
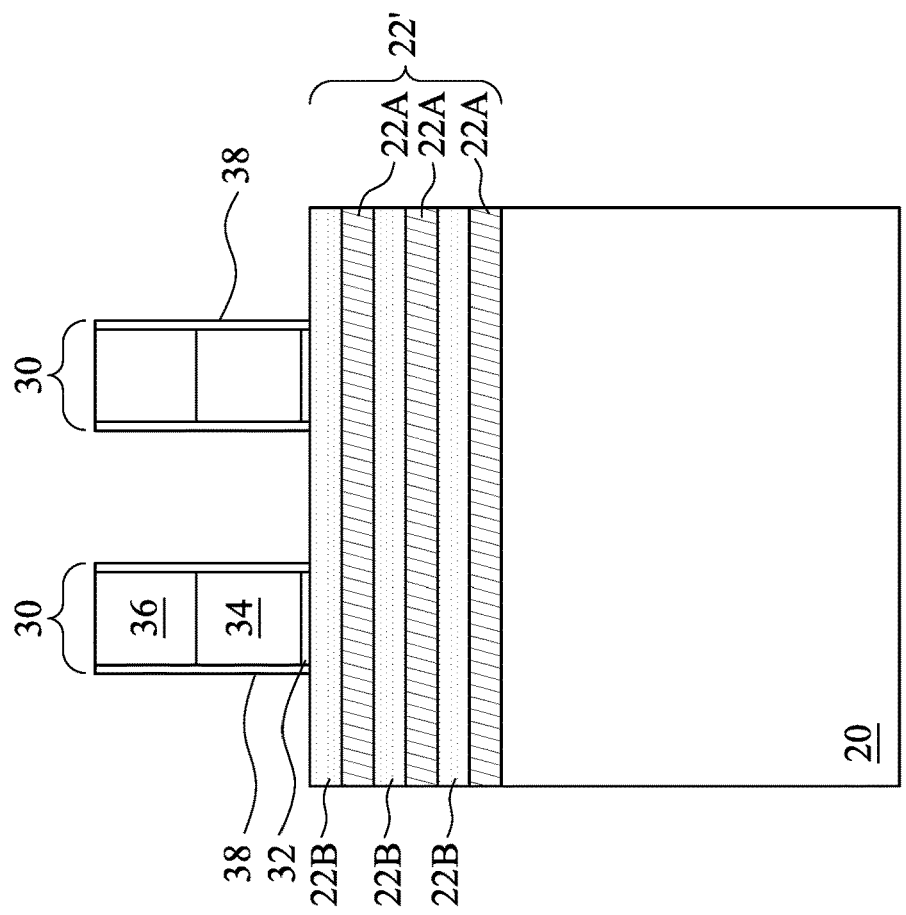
Figure 5A:
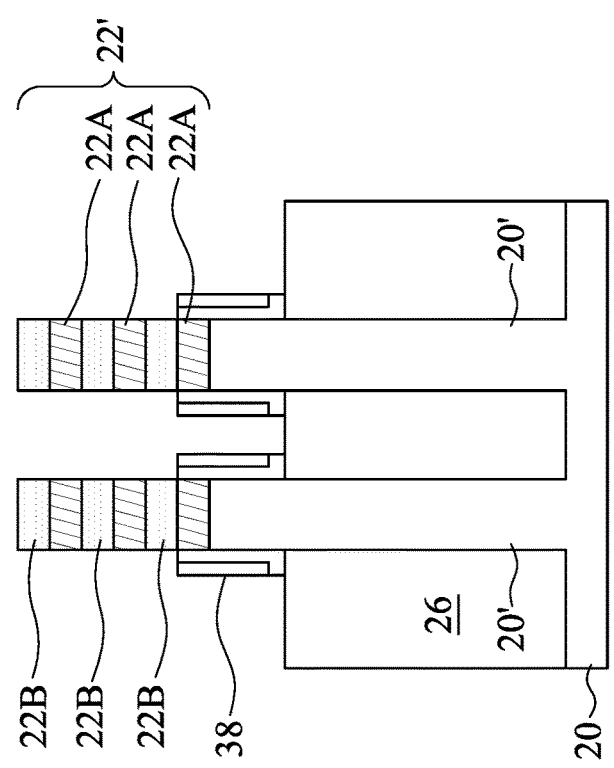

FIGS. 5A and 5B illustrate the cross-sectional views of the structure shown in FIG. 4. FIG. 5A illustrates the reference cross-section A1-A1 in FIG. 4, which cross-section cuts through the portions of protruding fins 28 not covered by gate stacks 30 and gate spacers 38, and is perpendicular to the gate-length direction. Fin spacers 38, which are on the sidewalls of protruding fins 28, are also illustrated. FIG. 5B illustrates the reference cross-section B-B in FIG. 4, which reference cross-section is parallel to the lengthwise directions of protruding fins 28.

Figure 6B:
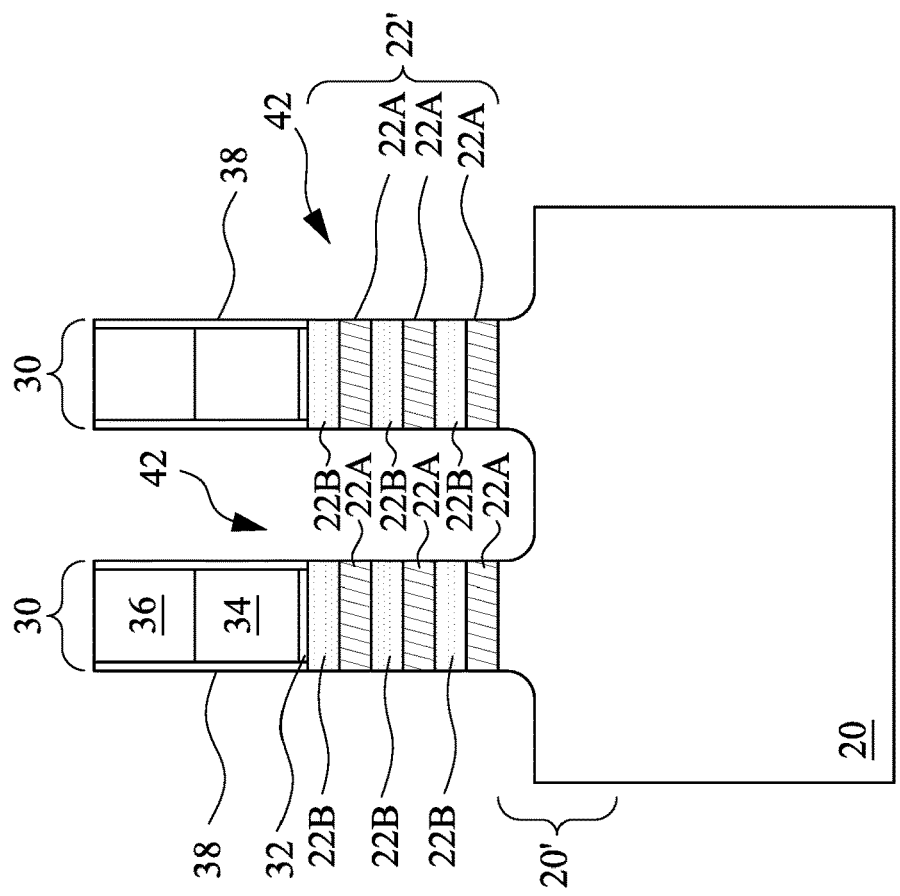
Figure 6A:
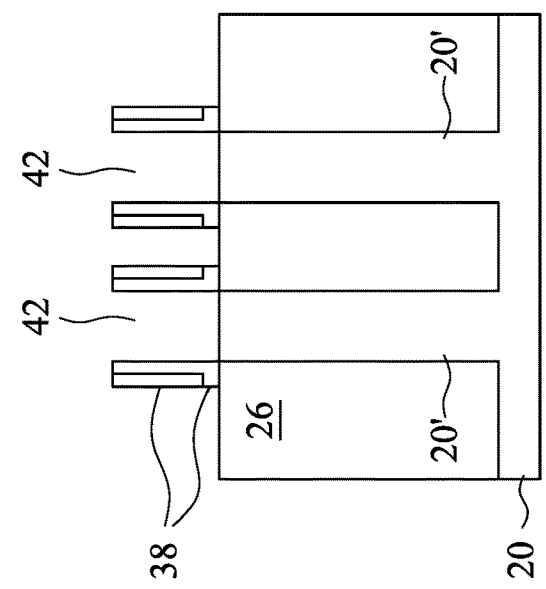

Referring to FIGS. 6A and 6B, the portions of protruding fins 28 that are not directly underlying dummy gate stacks 30 and gate spacers 38 are recessed through an etching process to form recesses 42. The respective process is illustrated as process 210 in the process flow 200 shown in FIG. 24. For example, a dry etch process may be performed using $C_2F_6$, $CF_4$, $SO_2$, the mixture of HBr, $Cl_2$, and $O_2$, the mixture of HBr, $Cl_2$, $O_2$, and $CH_2F_2$, or the like to etch multilayer semiconductor stacks 22' and the underlying substrate strips 20'. The bottoms of recesses 42 are at least level with, or may be lower than (as shown in FIG. 6B), the bottoms of multilayer semiconductor stacks 22'. The etching may be anisotropic, so that the sidewalls of multilayer semiconductor stacks 22' facing recesses 42 are vertical and straight, as shown in FIG. 6B.

Figure 7B:
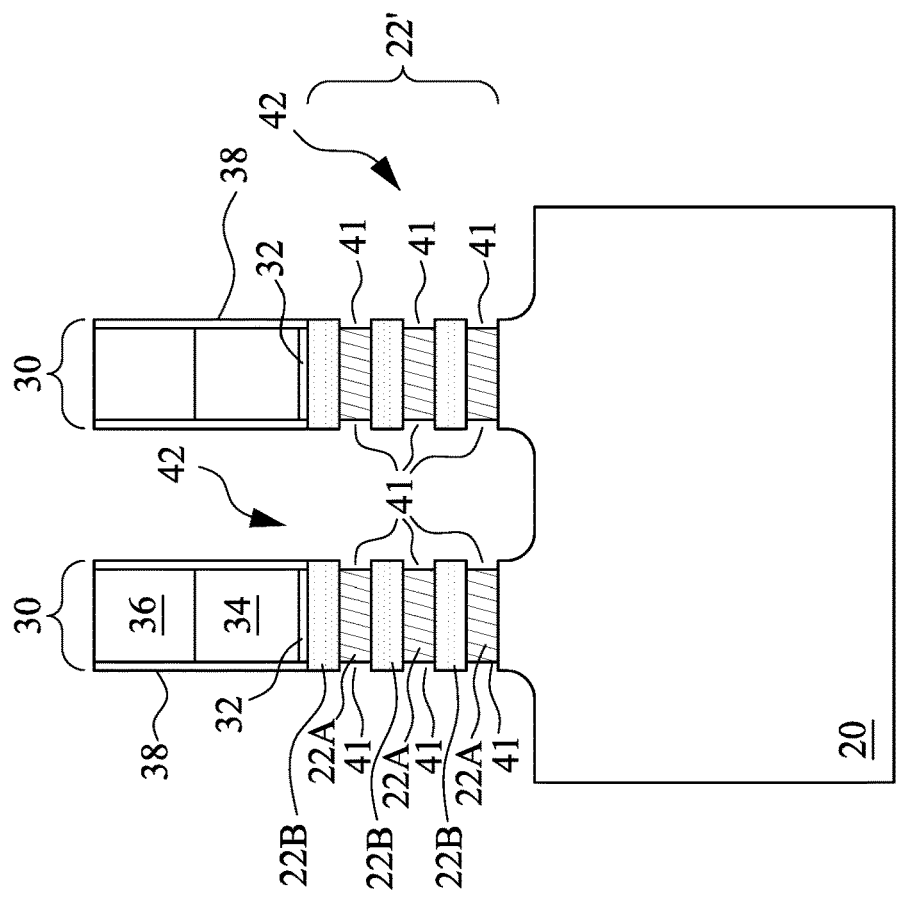
Figure 7A:
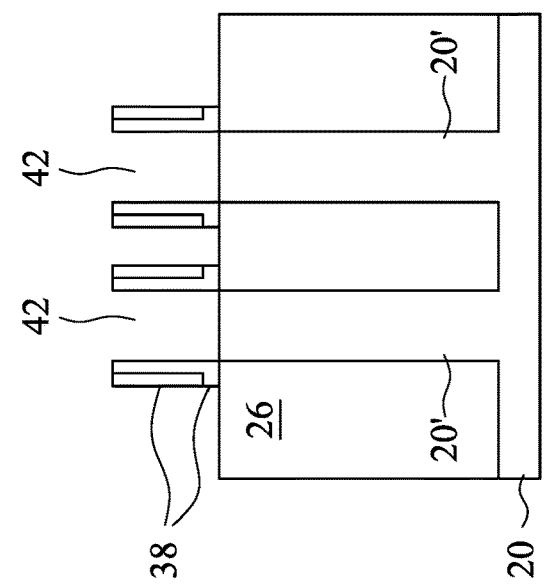

Referring to FIGS. 7A and 7B, sacrificial semiconductor layers 22A are laterally recessed to form lateral recesses 41, which are recessed from the edges of the respective overlying and underlying nanostructures 22B. The respective process is illustrated as process 212 in the process flow 200 shown in FIG. 24. The lateral recessing of sacrificial semiconductor layers 22A may be achieved through a wet etching process using an etchant that is more selective to the material (for example, silicon germanium (SiGe)) of sacrificial semiconductor layers 22A than the material (for example, silicon (Si)) of the nanostructures 22B and substrate 20. For example, in an embodiment in which sacrificial semiconductor layers 22A are formed of silicon germanium and the nanostructures 22B are formed of silicon, the wet etching process may be performed using an etchant such as hydrochloric acid (HCl). The wet etching process may be performed using a dip process, a spray process, a spin-on process, or the like, and may be performed using any suitable process temperatures (for example, between about 400° C. and about 600° C.) and a suitable process time (for example, between about 100 seconds and about 1,000 seconds). In accordance with alternative embodiments, the lateral recessing of sacrificial semiconductor layers 22A is performed through an isotropic dry etching process or a combination of a dry etching process and a wet etching process.

Figure 8B:
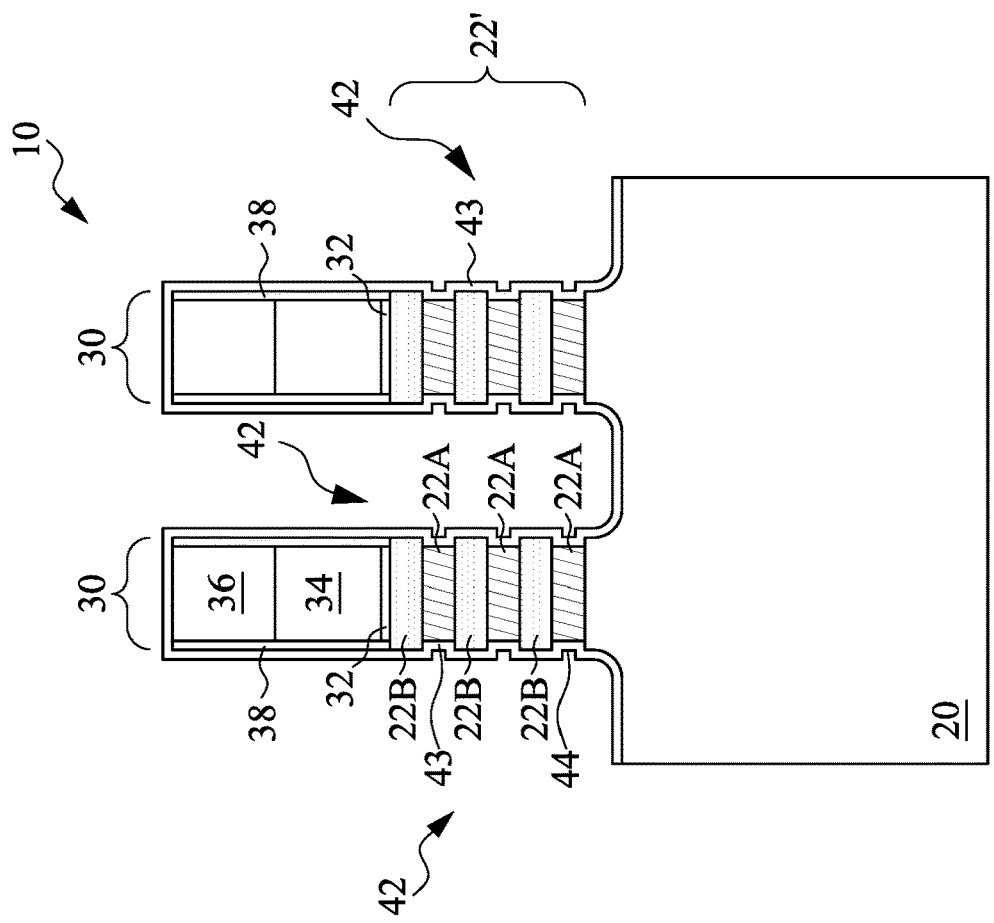
Figure 8A:
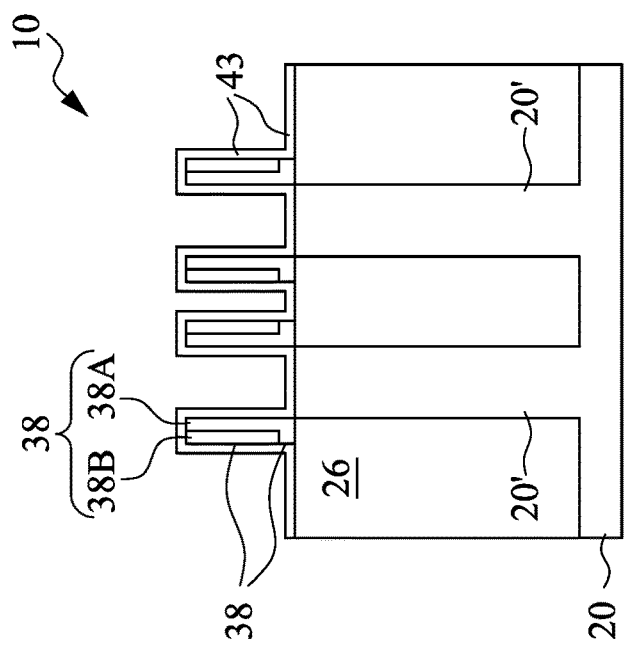

FIGS. 8A and 8B illustrate the deposition of spacer layer 43, which comprises SiOCNH therein. The respective process is illustrated as process 214 in the process flow 200 shown in FIG. 24. Spacer layer 43 is deposited as a conformal layer, and has a relatively low k value, which may range from about 3.4 to about 4.2. Accordingly, spacer layer 43 may sometimes be formed as a low-k dielectric layer (when its k value is lower than about 3.8), depending on the formation process. The thickness of spacer layer 43 may be in the range between about 4 nm and about 6 nm.

FIG. 19 illustrates some details of process 214 for depositing spacer layer 43, wherein some example intermediate chemical structures of spacer layer 43 are illustrated. It is appreciated that the processes and structures as shown in (and discussed referring to) FIG. 19 are schematic, and other reaction mechanism and structures may also happen. The intermediate structures shown in FIG. 19 are identified using reference numerals 112, 114, 116, 118, 120, and 122 to distinguish the structures generated by different steps from each other. Wafer 10 includes base layer 110, which may represent the exposed features including substrate 20, sacrificial semiconductor layers 22A, and the nanostructures 22B in FIGS. 8A and 8B. The initial structure in FIG. 19 is referred to as structure 112. In the illustrated example, base layer 110 is shown as including silicon, which may be in the form of crystalline silicon, amorphous silicon, polysilicon, SiGe, or the like. Base layer 110 may also include other types of silicon-containing compounds such as silicon oxide, silicon nitride, silicon oxy-carbide, silicon oxynitride, or the like, which may form gate spacers 38 and mask layer 36. In accordance with some embodiments of the present disclosure, due to the formation of native oxide and the exposure to moisture, Si—OH bonds are formed at the surface of the silicon-containing base layer 110.

Figure 25:
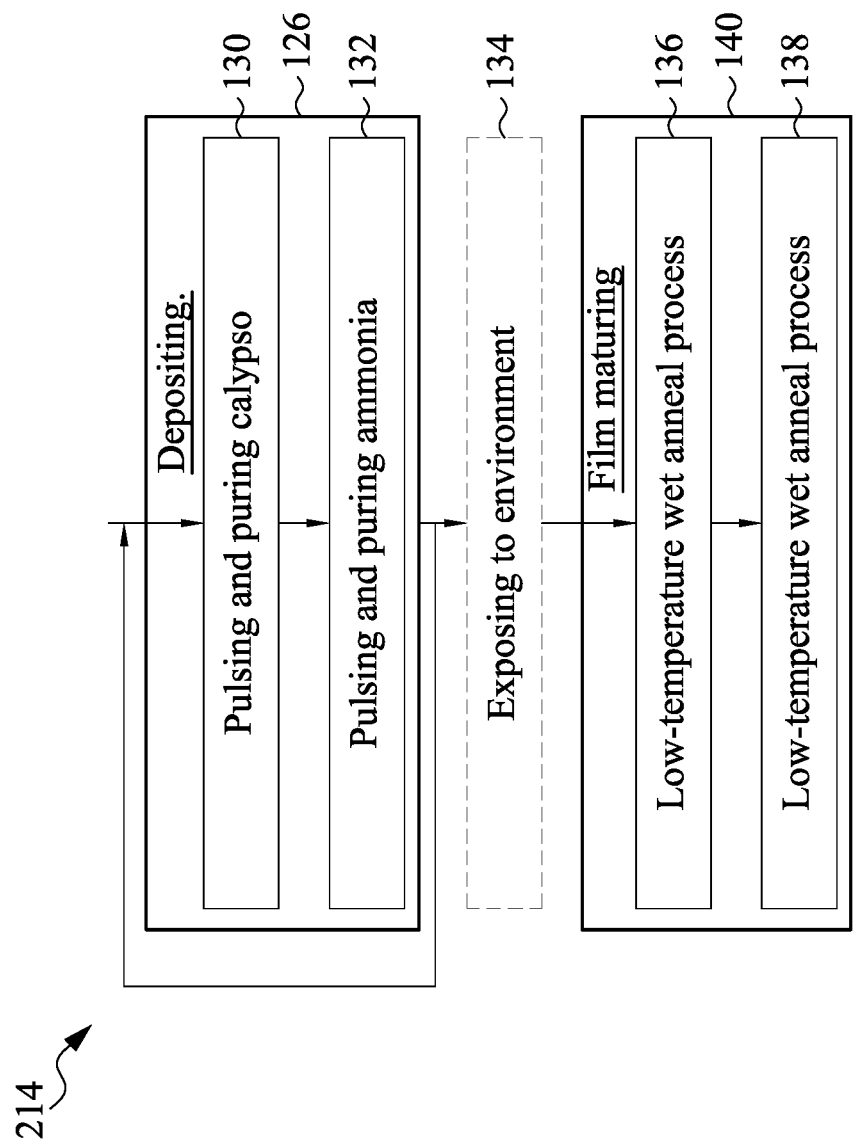
FIG. 25 illustrates a process flow for depositing a spacer layer in accordance with some embodiments.

Referring to FIG. 19 again, a first ALD cycle is performed to deposit spacer layer 43 as in FIG. 8B. Referring to process 130, calypso (($SiCl_3)_2CH_2$) is introduced/pulsed into an ALD chamber, in which wafer 10 (FIGS. 8A and 8B) is placed. The respective process is illustrated as process 130 as shown in FIG. 25. Calypso has the chemical formula ($SiCl_3)_2CH_2$, and FIG. 20 illustrates a chemical structure of a calypso molecule. The chemical structure shows that the calypso molecule includes chlorine atoms bonded to two silicon atoms, which are bonded to a carbon atom to form a Si—C—Si bond. When calypso is pulsed into the ALD chamber, wafer 10 may be heated, for example, to a temperature in the range between about 300° C. and about 600° C. The OH bonds as shown in structure 112 (FIG. 19) are broken, and silicon atoms along with the chlorine atoms bonded to them are bonded to oxygen atoms to form O—Si—Cl bonds. Si—C—Si (with the C being in $CH_2$) are also formed to form a bridge structure connecting two Si—O bonds. The resulting structure is referred to as structure 114. In accordance with some embodiments of the present disclosure, no plasma is turned on when calypso is introduced. The calypso gas may be kept in the ALD chamber for a period of time between about 20 seconds and about 25 seconds. The pressure of the ALD chamber may be in the range between about 100 Pa and about 150 Pa in accordance with some embodiments.

Next, calypso is purged from the ALD chamber. The respective process is also illustrated as process 130 as shown in FIG. 25. Next, Further referring to FIG. 19, process 132 is performed, and a process gas including a nitrogen atom(s) and/or hydrogen atom(s) is pulsed into the ALD chamber. For example, ammonia ($NH_3$) may be pulsed. The respective process is illustrated as process 132 in the process 214 as shown in FIG. 25. With the introduction/pulsing of ammonia, the temperature of wafer 10 is also kept elevated, for example, in the range between about 300° C. and about 600° C. In accordance with some embodiments of the present disclosure, no plasma is turned on when ammonia is introduced. During the pulsing of ammonia, the ALD chamber may have a pressure in the range between about 800 Pa and about 1,000 Pa.

Structure 114 reacts with ammonia. The resulting structure is referred to as structure 116, as shown in FIG. 19. During the reaction, some of Si—Cl bonds in structure 114 are broken, so that $NH_2$ molecules may be bonded to silicon atoms. The ammonia may be kept in the ALD chamber for a period of time in the range between about 5 seconds and about 15 seconds, and is then purged from the ALD chamber. The respective purging process is also illustrated as process 210 in the process 214 as shown in FIG. 25.

In above-discussed processes, the processes 130 and 132 in combination may be referred to as an ALD cycle 126, with ALD cycle 126 resulting in the growth of an atomic layer, which includes silicon atoms and the corresponding bonded chlorine atoms, $NH_2$, and $CH_2$ groups.

The ALD cycle 126 (FIG. 25) may be repeated to increase the thickness of spacer layer 43. FIG. 21 illustrates an example structure 124, in which an additional layer of spacer layer 43 is illustrated, with more calypso molecules attached to the underlying structure. The ALD cycles are repeated until spacer layer 43 reaches a desirable thickness, such as in the range between about 4 nm and about 6 nm.

In accordance with some embodiments, after the ALD cycles, wafer 10 may go through a vacuum break (process 134 in FIG. 19), and is exposed to air. The respective process is illustrated as process 134 as shown in FIG. 25. In accordance with some embodiments, the exposure of spacer layer 43 to the moisture ($H_2O$) results in some Si—N bonds (Si—$NH_2$) to break, and the silicon atoms are bonded to OH groups. Structure 118 (FIG. 19) is thus formed. In accordance with alternative embodiments, the vacuum break does not occur, and wafer 10 is kept in the ALD chamber. The deposited layers thus will remain to have the structures as represented by structure 116 in FIG. 19 and the structure 124 in FIG. 21.

Next, referring to FIG. 19, a film maturing process 140 is performed. The respective process is illustrated in FIG. 25. The film maturing process 140 includes a wet anneal process 136 (FIG. 19). The respective process is also illustrated as process 136 as shown in FIG. 25. In the wet anneal process 136, the deposited structure is annealed in a furnace, with water steam ($H_2O$) introduced into the furnace. The wet anneal process may be performed at a pressure of one atmosphere, while it may also be performed in a process chamber (such as the ALD chamber for depositing spacer layer 43) at a pressure lower than one atmosphere. The wet anneal process results in more Si—N bonds (Si—$NH_2$) to break, and the silicon atoms are bonded to OH groups. There may also be some $NH_2$ molecules left after the wet anneal process. The wet anneal process may be performed at a temperature in the range between about 300° C. and about 500° C. The duration of the wet anneal process may be in the range between about 0.5 hours and about 6 hours. The resulting structure may also be represented by structure 120 as shown in FIG. 19.

In accordance with alternative embodiments, instead of performing the wet anneal process, an oxidation process is performed, in which oxygen ($O_2$) is used as a process gas. The oxidation process may also be performed in a furnace, with the pressure being one atmosphere, or in a process chamber (such as the ALD chamber), with the pressure being lower than one atmosphere. The oxidation process may be performed at a temperature in the range between about 300° C. and about 500° C. The duration of the oxidation may be in the range between about 0.5 hours and about 6 hours. In the oxidation process, oxygen may also replace the NH part of $NH_2$ (which are bonded to Si atoms) to form Si—OH bonds, and the resulting structure may also be represented by structure 120.

After the wet anneal process or the oxidation process, a dry anneal process 138 is performed, which is also a part of the film mature process, as shown in FIG. 19. The respective process is also illustrated as process 138 in the process 214 as shown in FIG. 25. In the dry anneal process, an oxygen-free process gas such as nitrogen ($N_2$), argon, or the like may be used to carry away the generated $H_2O$ steam. The temperature of the dry anneal process may be higher than the temperature of the wet anneal process. In accordance with some embodiments of the present disclosure, the dry anneal process is performed at a temperature in the range between about 400° C. and about 600° C. The dry anneal process may last for a period of time in the range between about 0.5 hours and about 6 hours. The pressure may be around 1 atmosphere.

The structure 122 as shown in FIG. 19 represents an example structure formed after the dry anneal process. Structure 122 includes two of the neighboring structures 120 joined together. In accordance with some embodiments, a first Si-OH bond in the first structure 120 and a second Si—OH bonding in a second structure 120 are both broken, generating a Si—O—Si bond and a $H_2O$ molecule. The $H_2O$ molecule is carried away, and the resulting dry anneal process is thus also referred to as a de-moisture process. Also, some of the Si—$CH_2$—Si bonds (which includes Si-C-Si bonds) react with $H_2O$ molecules (either in air or generated by the de-moisture process) to form Si—OH bonds and Si—$CH_3$ bonds. The resulting film is spacer layer 43, which is also shown in FIGS. 8A and 8B. The formation of Si—$CH_3$ bonds results in the k value of the resulting spacer layer 43 to be reduced. For example, before the film mature process 140 is performed, the k value of the as-deposited spacer layer 43 may be in the range between about 4.5 and about 6.0, and after the film mature process, the k value of the deposited spacer layer 43 may be in the range between about 3.4 and about 4.2. In accordance with some embodiments in which spacer layer 43 has a k value lower than about 3.8 (and may be in the range between about 3.5 and 3.8), spacer layer 43 is a low-k dielectric layer. Spacer layer 43 is also referred to as a SiOCNH layer, or a SiOCN layer due to the relative small amount of hydrogen.

As aforementioned, the processes as shown in FIG. 19 may also be used to form one or more layer in gate spacers 38. For example, gate spacers 38 may include inner layer 38A (FIG. 8A) in contact with dummy gate stack 30, and an outer layer 38B. Either one or both of inner layer 38A and outer layer 38B may be formed by depositing a dielectric layer(s) using the processes as shown in FIG. 19, followed by an anisotropic etching process to remove horizontal portions of the dielectric layer, leaving vertical portions of the dielectric layer as the gate spacers. Forming gate spacers 38 using the processes as shown in FIG. 19 may reduce the k value, and reduce the parasitic capacitance between the gate and source/drain region. On the other hand, the resulting gate spacers 38 also have improved etching resistance, which helps in device reliability. For example, in the subsequent removal of the dummy gate stack 30, inner layers 38A are exposed to the etching chemicals and cleaning chemicals, and the improved etching resistance of inner layers 38A advantageously results in reduced damage to gate spacers 38.

In accordance with some embodiments, the dielectric films (such as spacer layer 43, FIG. 8B, or gate spacers 38) formed in accordance with the embodiments of the present disclosure may have a reduced density and a reduced k value. For example, the density may be in the range between about 1.7 g/cm$^3$ and about 2.0 g/cm$^3$, which is lower than the density (which is greater than 2.0 g/cm$^3$) of the conventional dielectric films formed of SiOCN, SiON, SiOC, SiCN, or the like. As aforementioned, the k value may be in the range between about 3.4 and about 4.2, and are lower than the k values of the conventional dielectric films. The dielectric films may have a silicon atomic percentage in the range between about 25 percent and about 35 percent, a carbon atomic percentage in the range between about 8 percent and about 18 percent, an oxygen atomic percentage in the range between about 30 percent and about 60 percent, and a nitrogen atomic percentage in the range between about 5 percent and about 25 percent. There is also be some hydrogen (for example, with the atomic percentage in the range between about 1 atomic percent and about 5 atomic percent) in the dielectric film, and hence the resulting films are SiOCNH films.

Figure 9B:
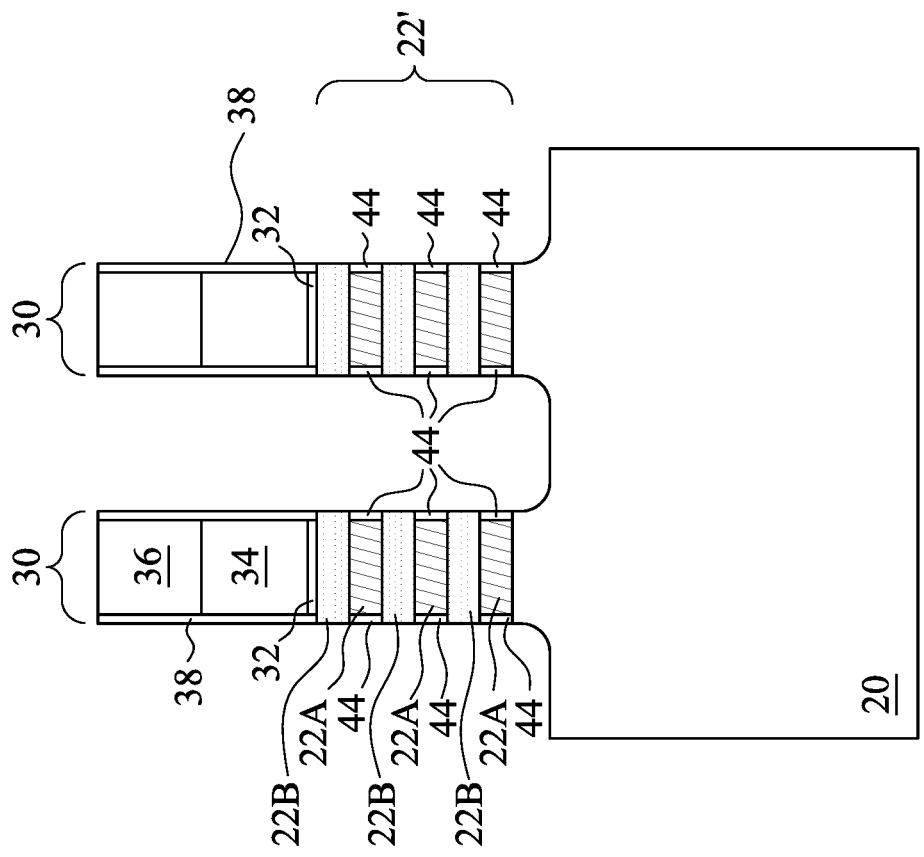
Figure 9A:
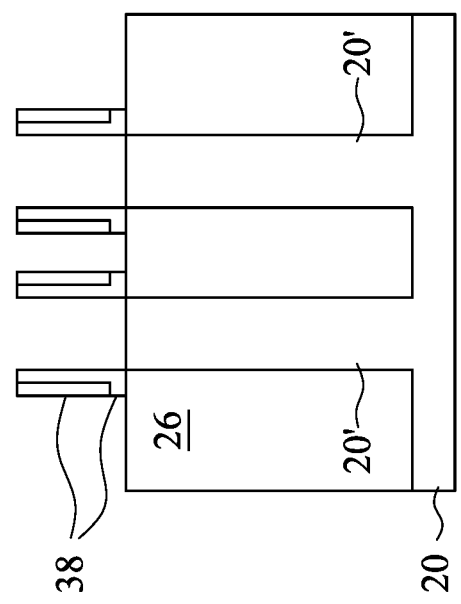

Referring back to FIGS. 8A and 8B, spacer layer 43 may be a conformal layer, which extends into the lateral recesses 41 (FIG. 7B). Next, an etching process (also referred to as a spacer trimming process) is performed to trim the portions of spacer layer 43 outside of the lateral recesses 41, leaving the portions of spacer layer 43 in the lateral recesses 41. The respective process is illustrated as process 216 in the process flow 200 shown in FIG. 24. The remaining portions of spacer layer 43 are referred to as inner spacers 44. FIGS. 9A and 9B illustrate the cross-sectional views of the inner spacers 44 in accordance with some embodiments. The etching of spacer layer 43 may be performed through a wet etching process, in which the etching chemical may include $H_2SO_4$, diluted HF, ammonia solution ($NH_4OH$, ammonia in water), or the like, or combinations thereof.

In accordance with alternative embodiments, the trimming process as shown in FIGS. 9A and 9B, instead of being performed after the film maturing process 140 as shown in FIG. 19, may be performed after the ALD cycles 126 for depositing dielectric layer 43, and before the film maturing process.

Figure 9C:
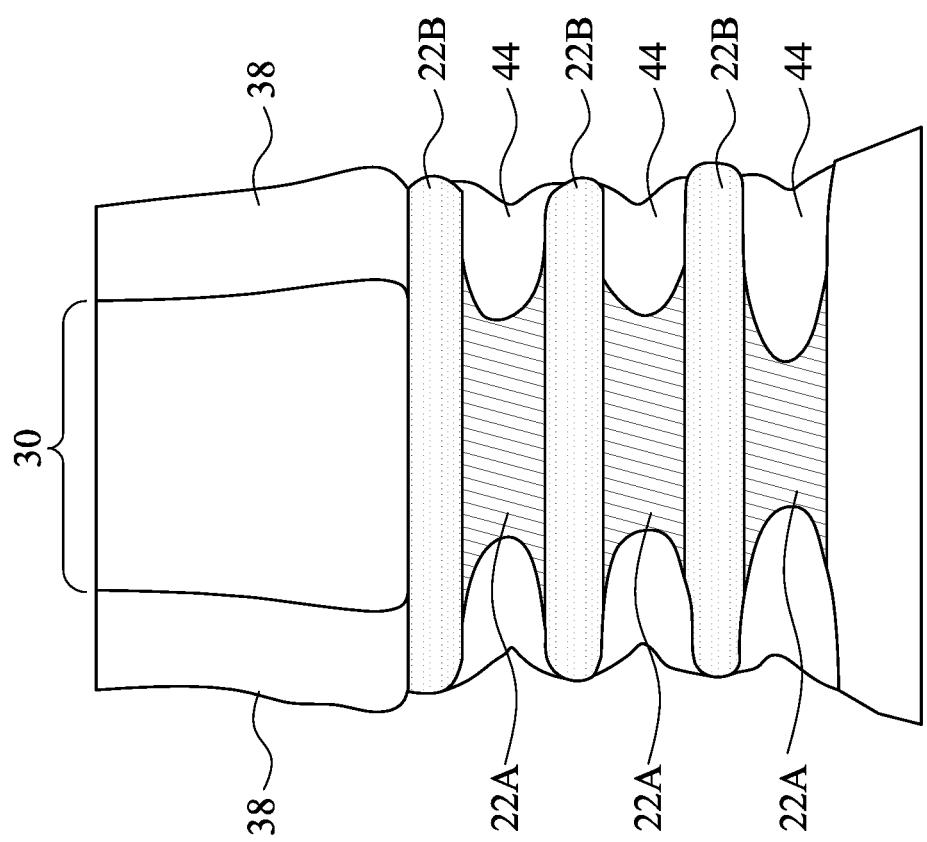

Although the inner sidewalls and the out sidewalls of the inner spacers 44 are schematically illustrated as being straight in FIG. 9B, the outer sidewalls of the inner spacers 44 may be concave or convex. As an example, FIG. 9C illustrates an amplified view of an embodiment in which sidewalls of sacrificial layers 22A are concave, outer sidewalls of the inner spacers 44 are concave, and the inner spacers 44 are recessed from the corresponding sidewalls of nano structures 22B. The inner spacers 44 may be used to prevent the damage to subsequently formed source/drain regions (such as the epitaxial source/drain regions 48), which damage may be caused by subsequent etching processes (FIG. 14B) for forming replacement gate structures.

In a subsequent process, a pre-clean process may be performed to remove the oxide formed on the surface of semiconductor materials including nano structures 22B and substrate 20. The respective process is illustrated as process 218 in the process flow 200 shown in FIG. 24. The pre-clean process may be performed using SiCONi ($NF_3$ and $NH_3$), Certas (HF and $NH_3$), HF (gas), a HF solution, or the like. Inner spacers 44, with the existence of cross-bonds Si—O—Si, are more resistant to the pre-clean process (than conventional dielectric materials with similar k values).

Figure 10B:
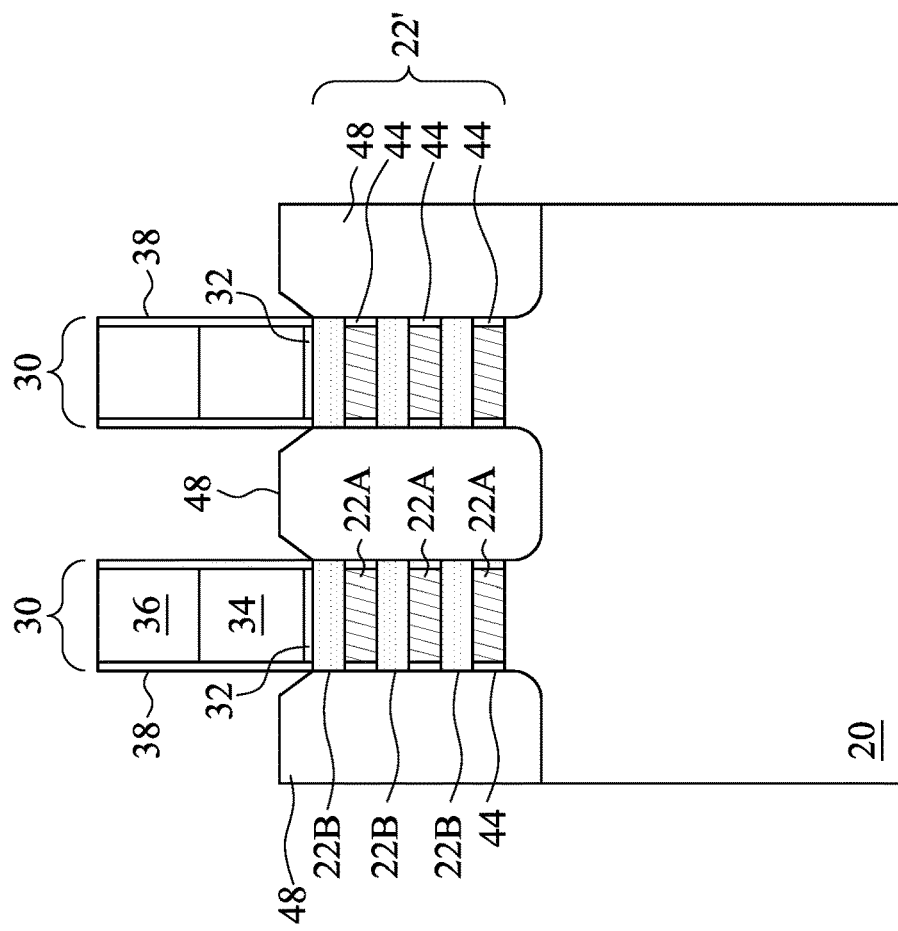
Figure 10A:
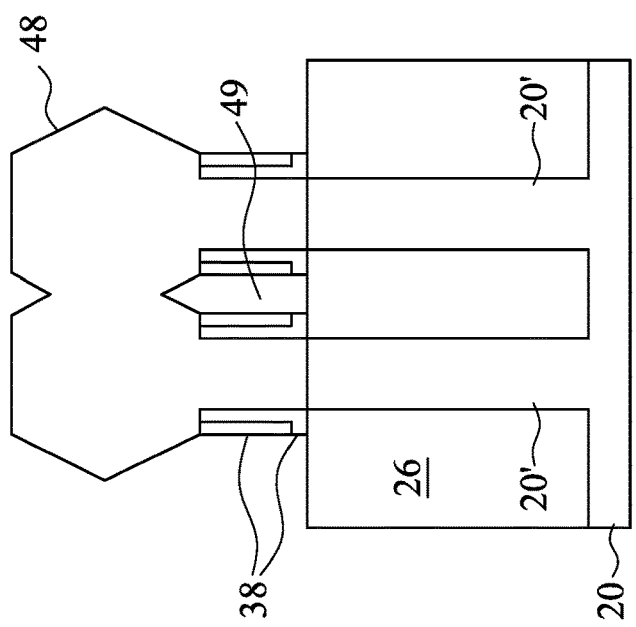

Referring to FIGS. 10A and 10B, epitaxial source/drain regions 48 are formed in recesses 42. The respective process is illustrated as process 220 in the process flow 200 shown in FIG. 24. In accordance with some embodiments, the source/drain regions 48 may exert stress on the nanostructures 22B, which are used as the channels of the corresponding GAA transistors, thereby improving performance. Depending on whether the resulting transistor is a p-type transistor or an n-type transistor, a p-type or an n-type impurity may be in-situ doped with the proceeding of the epitaxy. For example, when the resulting transistor is a p-type Transistor, silicon germanium boron (SiGeB), silicon boron (SiB), or the like may be grown. Conversely, when the resulting transistor is an n-type Transistor, silicon phosphorous (SiP), silicon carbon phosphorous (SiCP), or the like may be grown. After recesses 42 are filled with epitaxy regions 48, the further epitaxial growth of epitaxy regions 48 causes epitaxy regions 48 to expand horizontally, and facets may be formed. The further growth of epitaxy regions 48 may also cause neighboring epitaxy regions 48 to merge with each other. Voids (air gaps) 49 (FIG. 10A) may be generated.

After the epitaxy process, epitaxy regions 48 may be further implanted with a p-type or an n-type impurity to form source and drain regions, which are also denoted using reference numeral 48. In accordance with alternative embodiments of the present disclosure, the implantation process is skipped when epitaxy regions 48 are in-situ doped with the p-type or n-type impurity during the epitaxy, and the epitaxy regions 48 are also source/drain regions.

The subsequent figure numbers in FIGS. 11A, 11B, and 11C through FIGS. 18A, 18B, and 18C may have the corresponding numbers followed by letter A, B, or C. The figure with the figure number having the letter A indicates that the corresponding figure shows a reference cross-section same as the reference cross-section A2-A2 in FIG. 4, the figure with the figure number having the letter B indicates that the corresponding figure shows a reference cross-section same as the reference cross-section B-B in FIG. 4, and the figure with the figure number having the letter C indicates that the corresponding figure shows a reference cross-section same as the reference cross-section A1-A1 in FIG. 4.

Figure 11B:
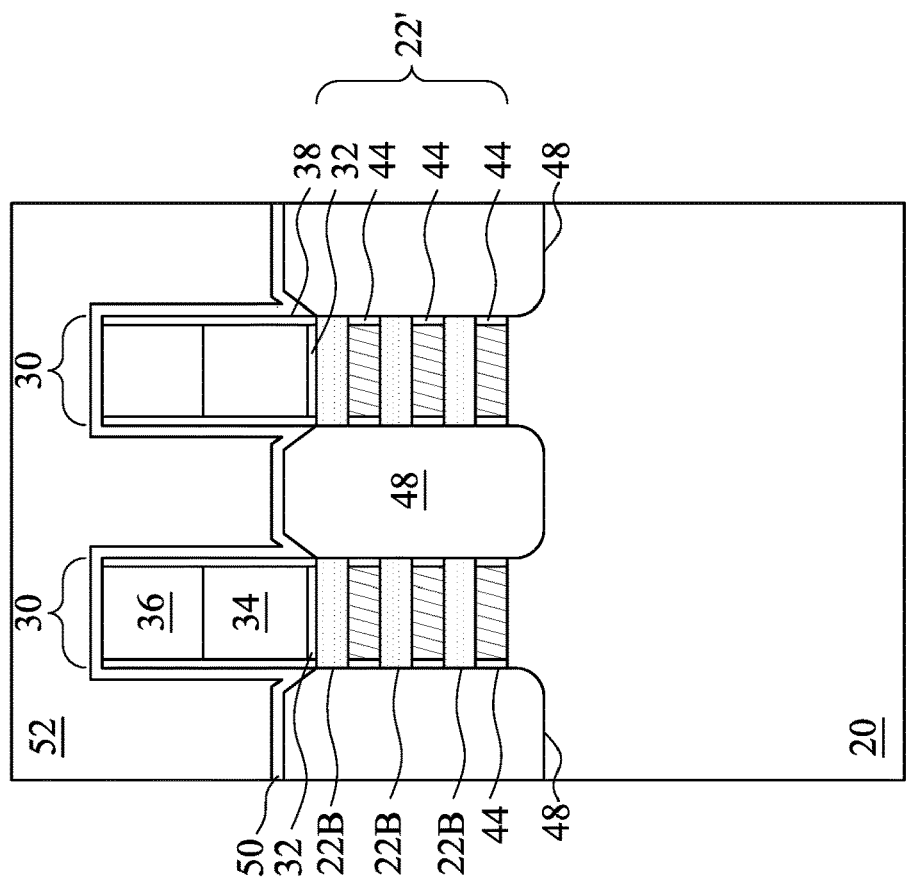
Figure 11A:
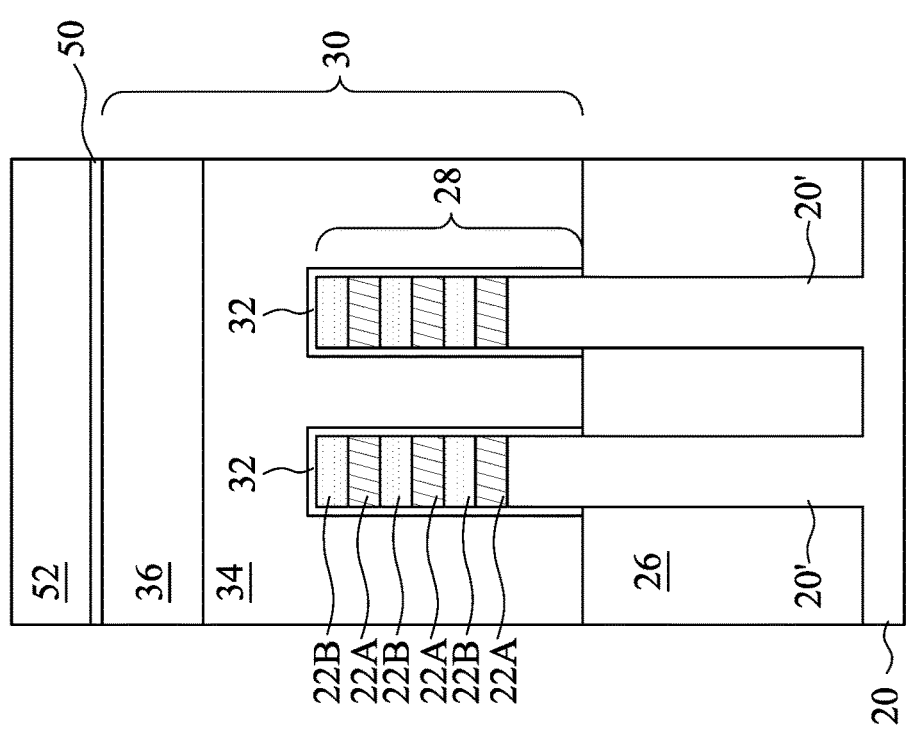
Figure 11C:
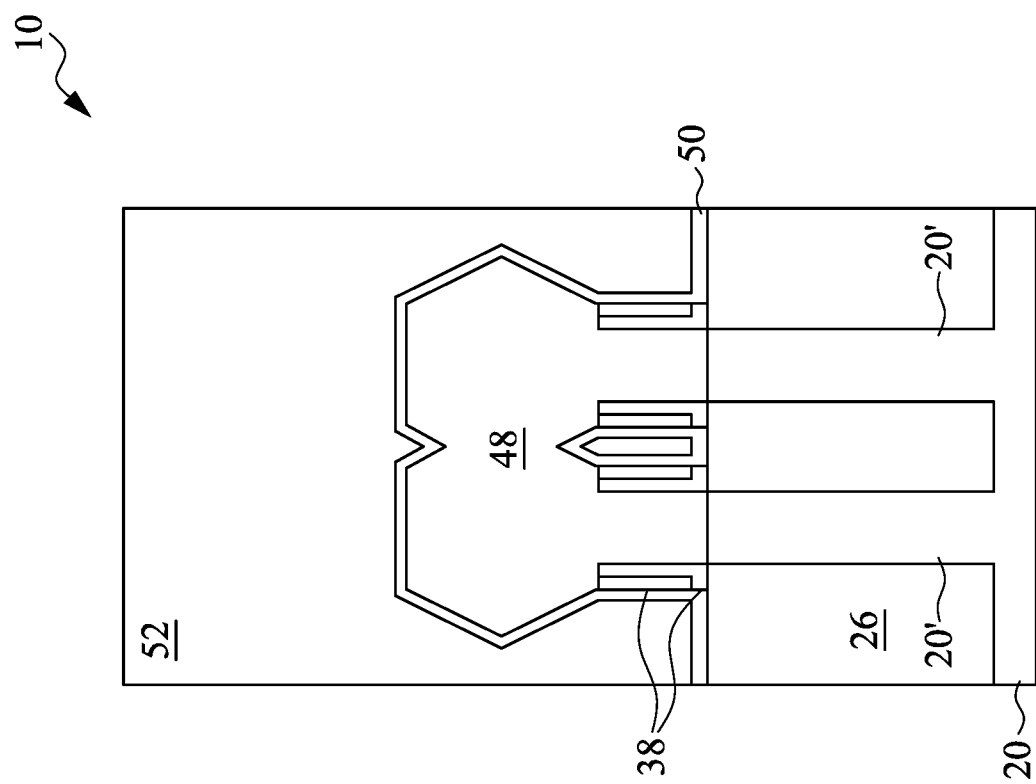

FIGS. 11A, 11B, and 11C illustrate the cross-sectional views of the structure after the formation of Contact Etch Stop Layer (CESL) 50 and Inter-Layer Dielectric (ILD) 52. The respective process is illustrated as process 222 in the process flow 200 shown in FIG. 24. CESL 50 may be formed of silicon oxide, silicon nitride, silicon carbo-nitride, or the like, and may be formed using CVD, ALD, or the like. ILD 52 may include a dielectric material formed using, for example, FCVD, spin-on coating, CVD, or any other suitable deposition method. ILD 52 may be formed of an oxygen-containing dielectric material, which may be a silicon-oxide based material formed using Tetra Ethyl Ortho Silicate (TEOS) as a precursor, Phospho-Silicate Glass (PSG), Boro-Silicate Glass (BSG), Boron-Doped Phospho-Silicate Glass (BPSG), Undoped Silicate Glass (USG), or the like.

Figure 12B:
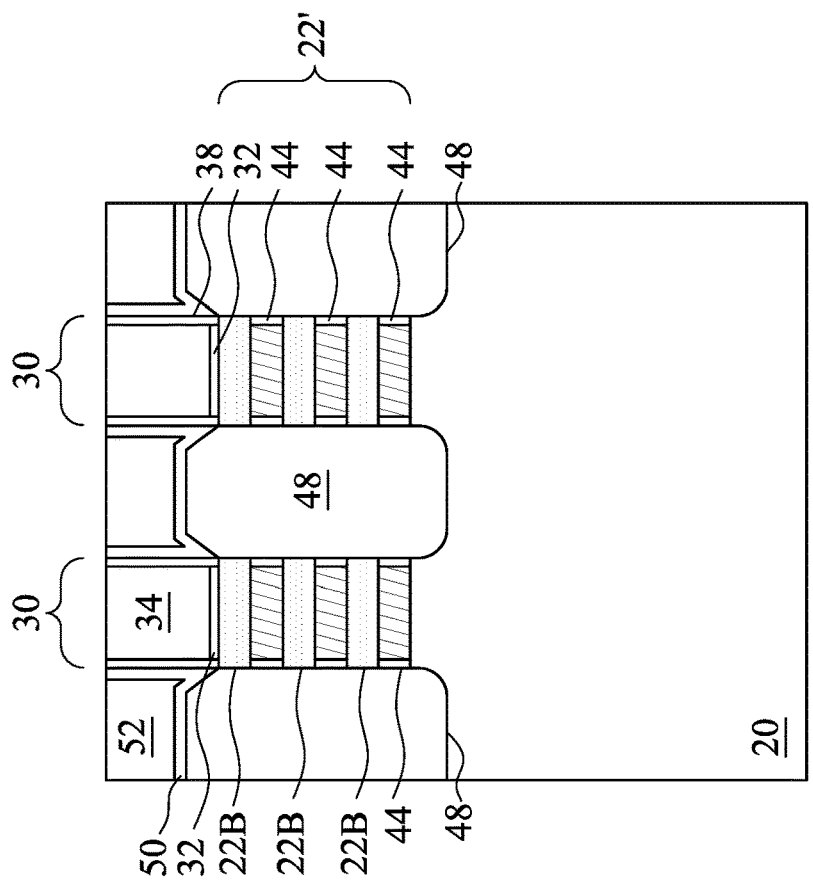
Figure 12A:
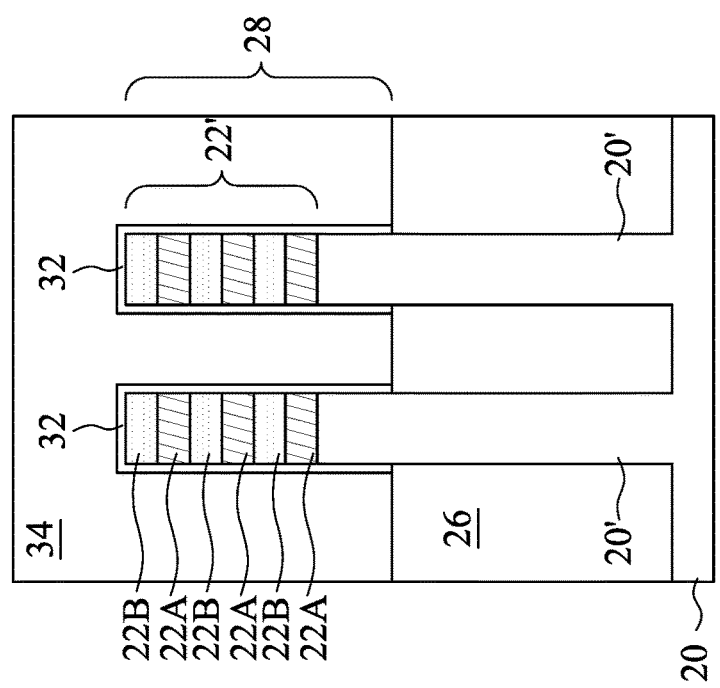

FIGS. 12A and 12B through FIGS. 16A and 16B illustrate the process for forming replacement gate stacks. In FIGS. 12A and 12B, a planarization process such as a CMP process or a mechanical grinding process is performed to level the top surface of ILD 52. The respective process is illustrated as process 224 in the process flow 200 shown in FIG. 24. In accordance with some embodiments, the planarization process may remove hard masks 36 to reveal dummy gate electrodes 34, as shown in FIG. 12A. In accordance with alternative embodiments, the planarization process may reveal, and is stopped on, hard masks 36. In accordance with some embodiments, after the planarization process, the top surfaces of dummy gate electrodes 34 (or hard masks 36), gate spacers 38, and ILD 52 are level within process variations.

Figure 13B:
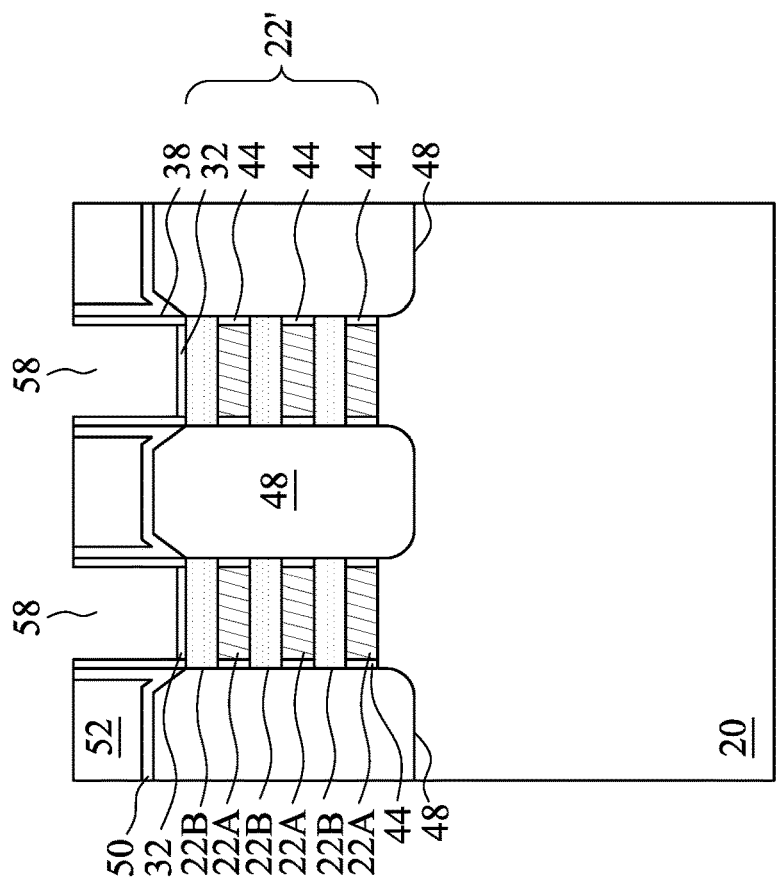
Figure 13A:
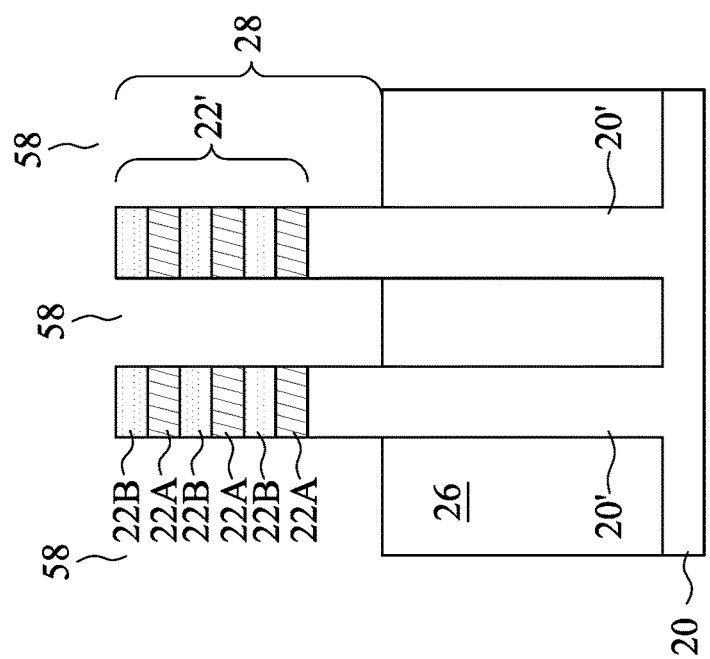

Next, dummy gate electrodes 34 (and hard masks 36, if remaining) are removed in one or more etching processes, so that recesses 58 are formed, as shown in FIGS. 13A and 13B. The respective process is illustrated as process 226 in the process flow 200 shown in FIG. 24. The portions of the dummy gate dielectrics 32 in recesses 58 are also removed. In accordance with some embodiments, dummy gate electrodes 34 and dummy gate dielectrics 32 are removed through an anisotropic dry etch process. For example, the etching process may be performed using reaction gas(es) that selectively etch dummy gate electrodes 34 at a faster rate than ILD 52. Each recess 58 exposes and/or overlies portions of multilayer stacks 22', which include the future channel regions in subsequently completed nano-FETs. The portions of the multilayer stacks 22', are between neighboring pairs of the epitaxial source/drain regions 48.

Figure 14B:
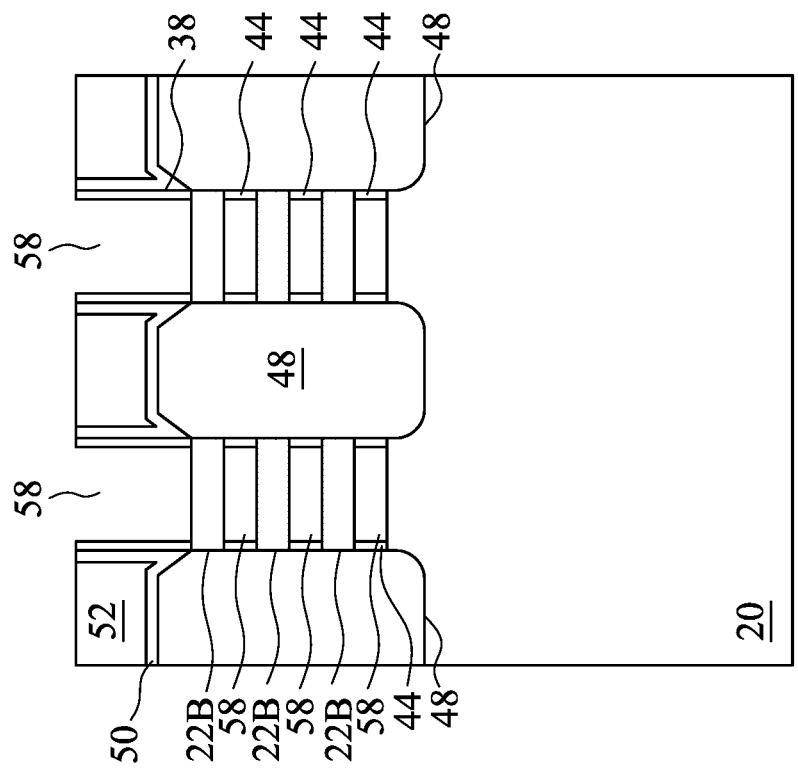
Figure 14A:
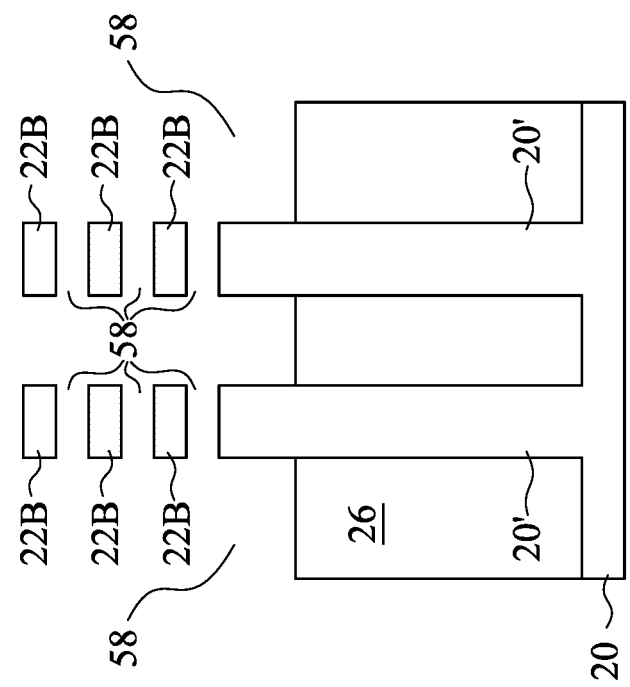

Sacrificial layers 22A are then removed to extend recesses 58 between nanostructures 22B, and the resulting structure is shown in FIGS. 14A and 14B. The respective process is illustrated as process 228 in the process flow 200 shown in FIG. 24. Sacrificial layers 22A may be removed by performing an isotropic etching process such as a wet etching process using etchants which are selective to the materials of sacrificial layers 22A, while nanostructures 22B, substrate 20, STI regions 26 remain relatively un-etched as compared to sacrificial layers 22A. In accordance with some embodiments in which sacrificial layers 22A include, for example, SiGe, and nanostructures 22B include, for example, Si or SiC, tetra methyl ammonium hydroxide (TMAH), ammonium hydroxide ($NH_4OH$), or the like may be used to remove sacrificial layers 22A.

Figure 15B:
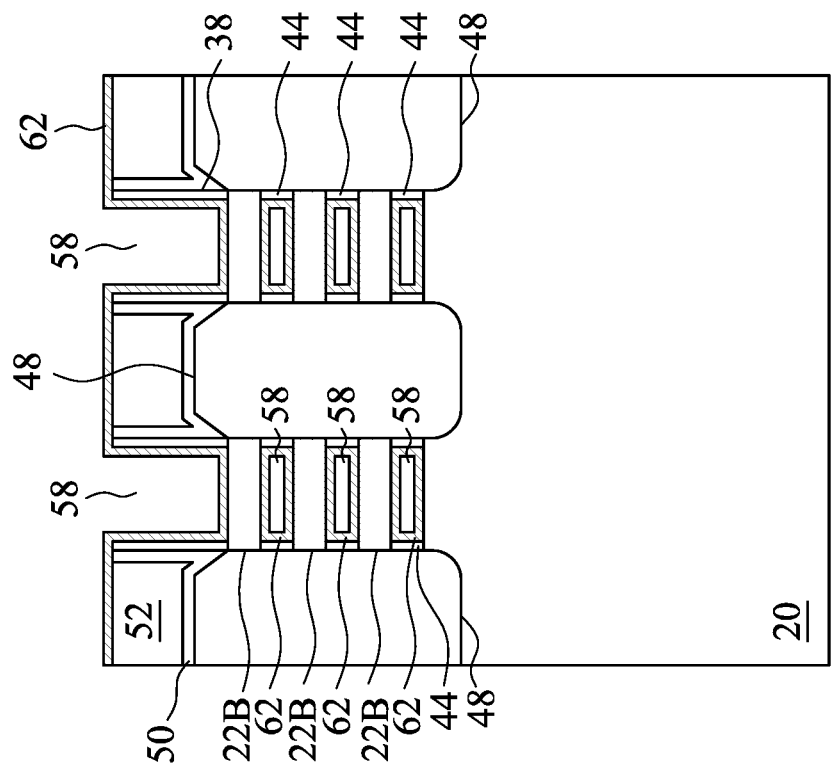
Figure 15A:
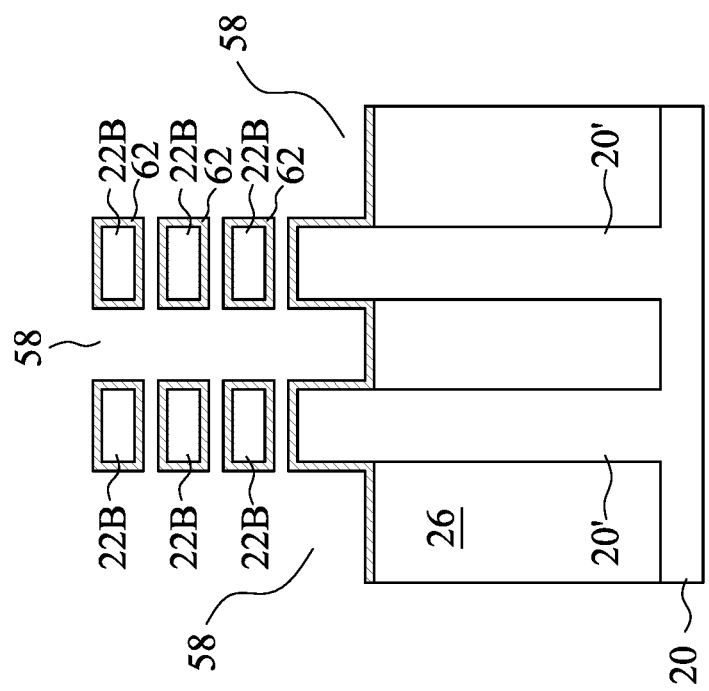

Referring to FIGS. 15A and 15B, gate dielectrics 62 are formed. The respective process is illustrated as process 230 in the process flow 200 shown in FIG. 24. In accordance with some embodiments, each of gate dielectrics 62 includes an interfacial layer and a high-k dielectric layer on the interfacial layer. The interfacial layer may be formed of or comprises silicon oxide, which may be deposited through a conformal deposition process such as ALD or CVD. In accordance with some embodiments, the high-k dielectric layers comprise one or more dielectric layers. For example, the high-k dielectric layer(s) may include a metal oxide or a silicate of hafnium, aluminum, zirconium, lanthanum, manganese, barium, titanium, lead, and combinations thereof.

Figure 16B:
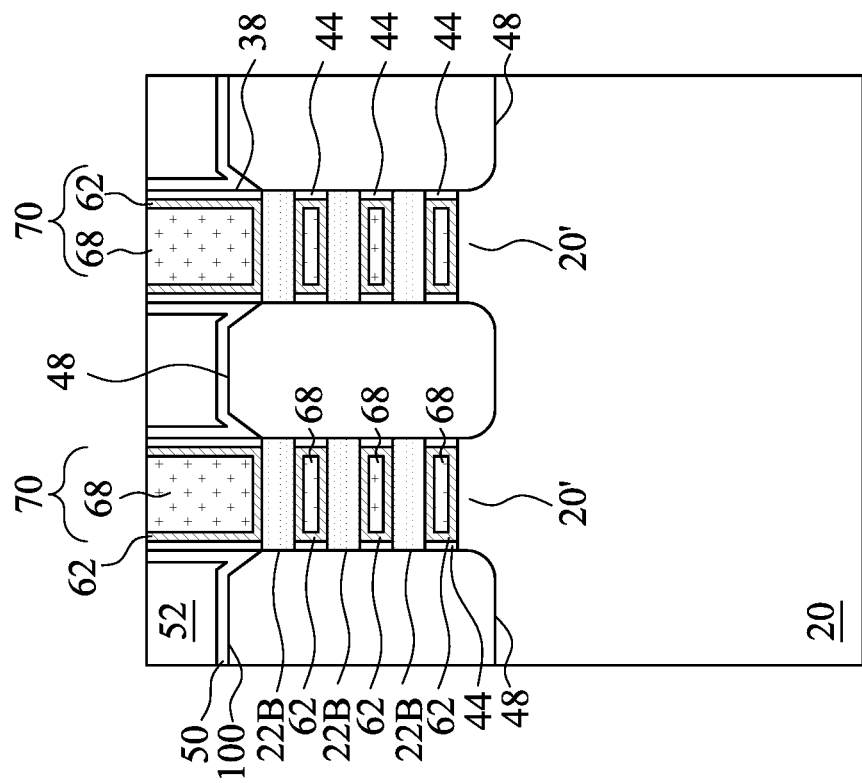
Figure 16A:
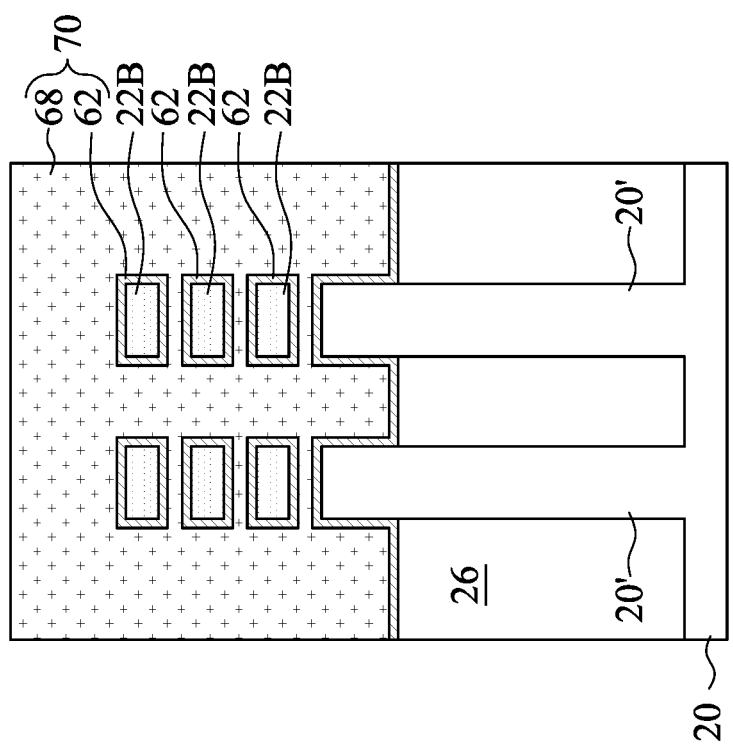

Referring to FIGS. 16A and 16B, gate electrodes 68 are formed. In the formation, conductive layers are first formed on the high-k dielectric layer, and fill the remaining portions of recesses 58. The respective process is illustrated as process 232 in the process flow 200 shown in FIG. 24. Gate electrodes 68 may include a metal-containing material such as TiN, TaN, TiAl, TiAlC, cobalt, ruthenium, aluminum, tungsten, combinations thereof, and/or multilayers thereof. For example, although single-layer gate electrodes 68 are illustrated in FIGS. 16A and 16B, gate electrodes 68 may comprise any number of layers, any number of work function layers, and possibly a filling material. Gate dielectrics 62 and gate electrodes 68 also fill the spaces between adjacent ones of nanostructures 22B, and fill the spaces between the bottom ones of nanostructures 22B and the underlying substrate strips 20'. After the filling of recesses 58, a planarization process such as a CMP process or a mechanical grinding process is performed to remove the excess portions of the gate dielectrics and the material of gate electrodes 68, which excess portions are over the top surface of ILD 52. Gate electrodes 68 and gate dielectrics 62 are collectively referred to as gate stacks 70 of the resulting nano-FETs.

Figure 17B:
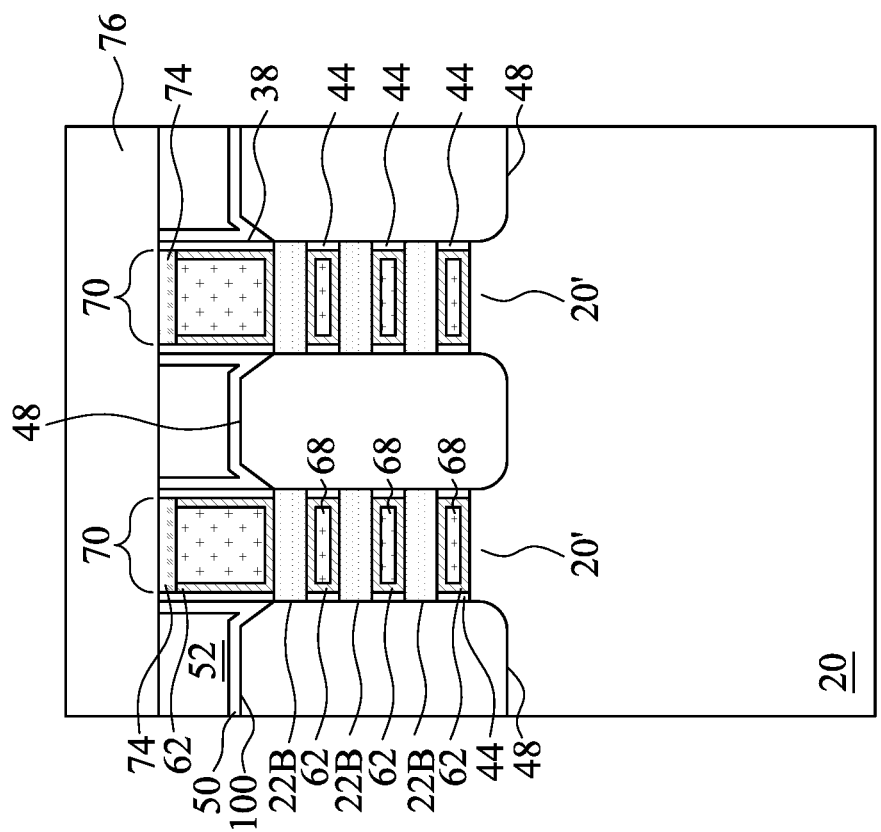
Figure 17A:
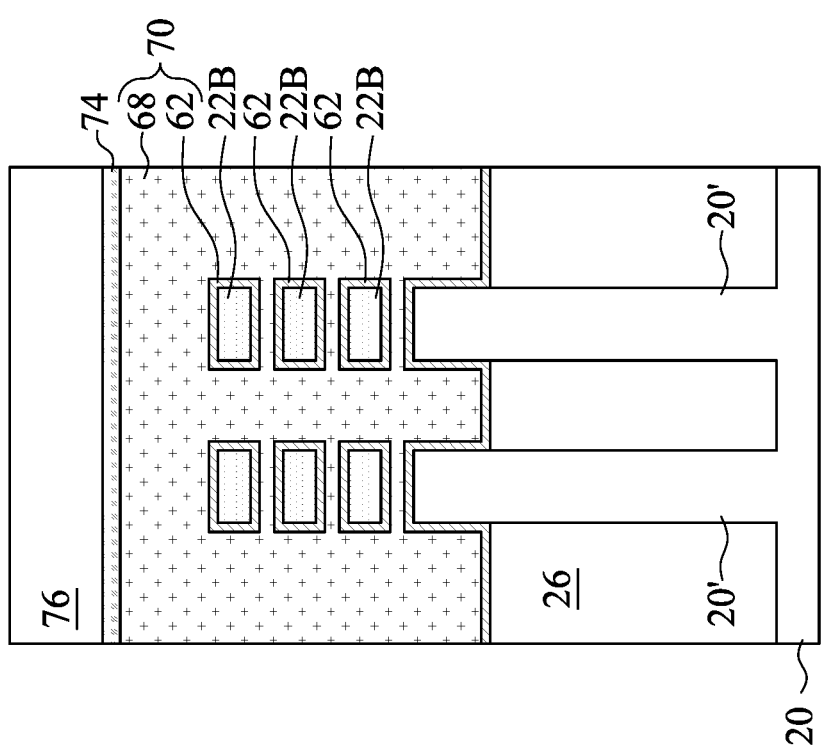
Figure 17C:
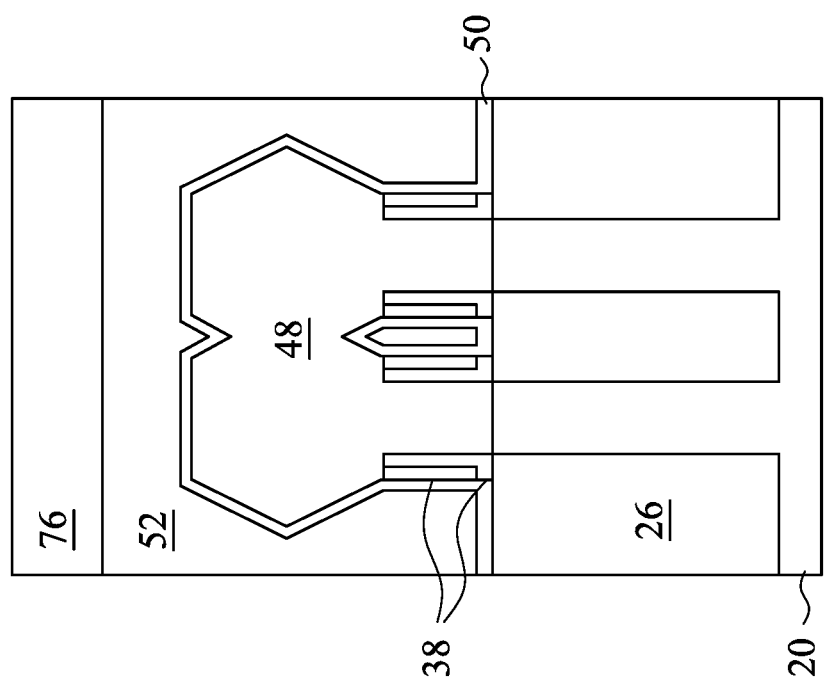

In the processes shown in FIGS. 17A, 17B, and 17C, gate stacks 70 are recessed, so that recesses are formed directly over gate stacks 70 and between opposing portions of gate spacers 38. A gate mask 74 comprising one or more layers of dielectric material, such as silicon nitride, silicon oxynitride, or the like, is filled in each of the recesses, followed by a planarization process to remove excess portions of the dielectric material extending over ILD 52. The respective process is illustrated as process 234 in the process flow 200 shown in FIG. 24.

As further illustrated by FIGS. 17A, 17B, and 17C, ILD 76 is deposited over ILD 52 and over gate masks 74. The respective process is illustrated as process 236 in the process flow 200 shown in FIG. 24. An etch stop layer (not shown), may be, or may not be, deposited before the formation of ILD 76. In accordance with some embodiments, ILD 76 is formed through FCVD, CVD, PECVD, or the like. ILD 76 is formed of a dielectric material, which may be selected from silicon oxide, PSG, BSG, BPSG, USG, or the like.

Figure 18B:
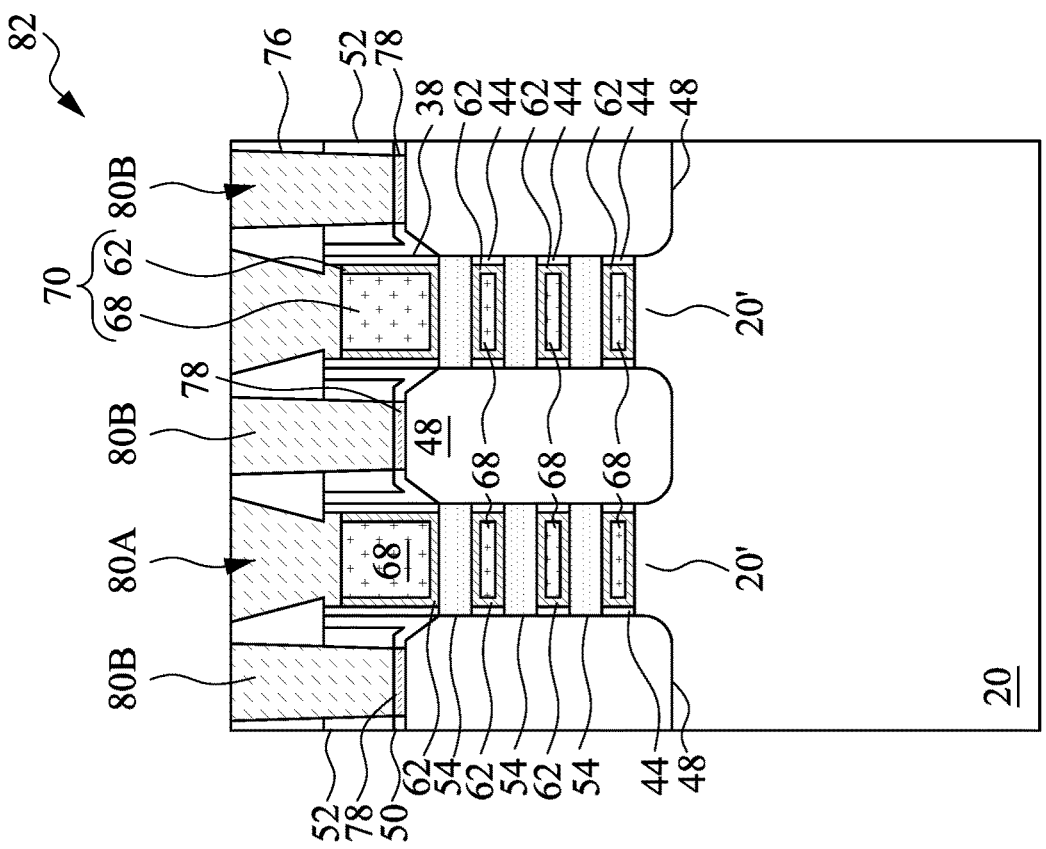
Figure 18A:
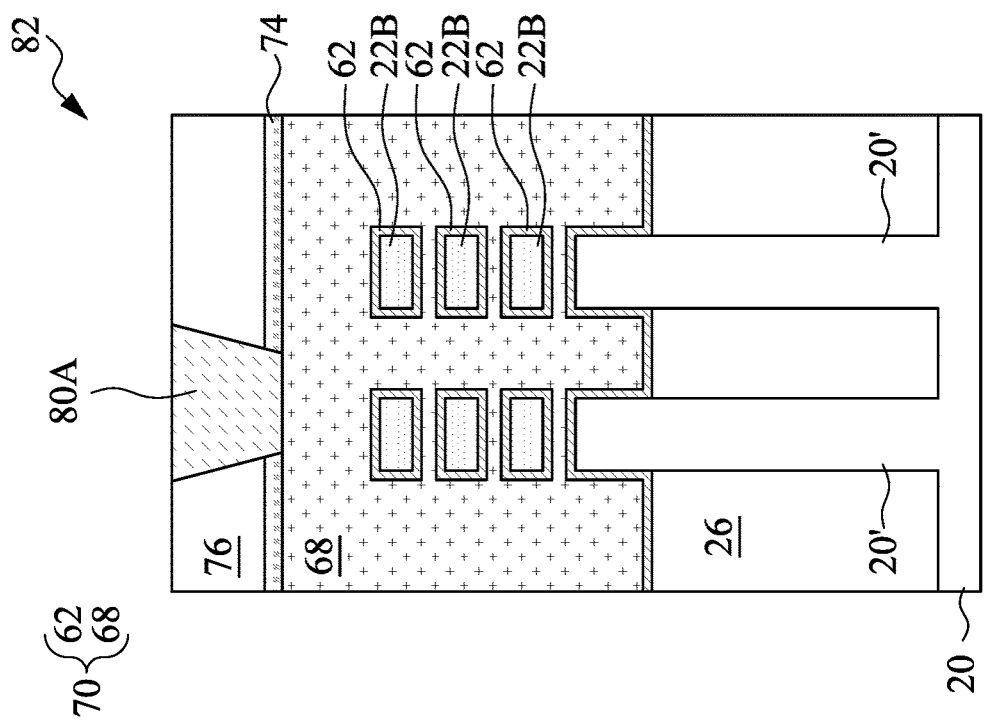
Figure 18C:
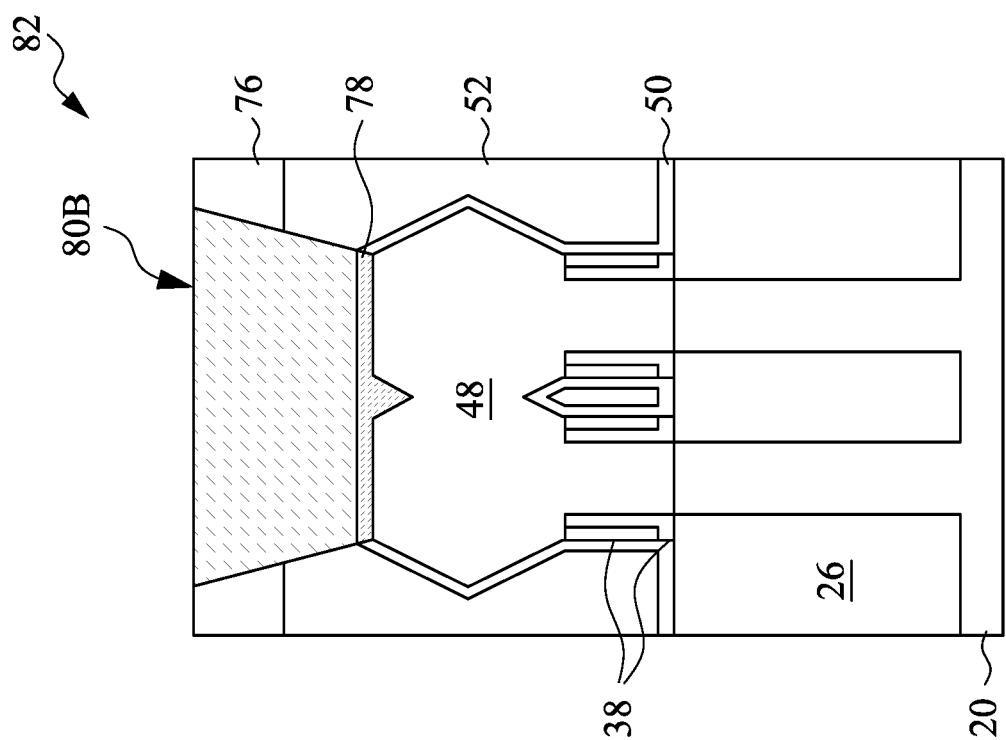

In FIGS. 18A, 18B, and 18C, ILD 76, ILD 52, CESL 50, and gate masks 74 are etched to form recesses (occupied by contact plugs 80A and 80B) exposing surfaces of the epitaxial source/drain regions 48 and/or gate stacks 70. The recesses may be formed through etching using an anisotropic etching process, such as RIE, NBE, or the like. In accordance with some embodiments, the recesses may be formed by etching-through ILD 76 and ILD 52 using a first etching process, etching-through gate masks 74 using a second etching process, and etching-through CESL 50 possibly using a third etching process. Although FIG. 18B illustrates that contact plugs 80A and 80B are in a same cross-section, in various embodiments, contact plugs 80A and 80B may be formed in different cross-sections, thereby reducing the risk of shorting with each other.

After the recesses are formed, silicide regions 78 (FIGS. 18B and 18C) are formed over the epitaxial source/drain regions 48. The respective process is illustrated as process 238 in the process flow 200 shown in FIG. 24. In accordance with some embodiments, silicide regions 78 are formed by first depositing a metal layer (not shown) capable of reacting with the semiconductor materials of the underlying epitaxial source/drain regions 48 (for example, silicon, silicon germanium, germanium) to form silicide and/or germanide regions, then performing a thermal anneal process to form silicide regions 78. The metal may include nickel, cobalt, titanium, tantalum, platinum, tungsten, or the like. The un-reacted portions of the deposited metal are then removed, for example, by an etching process.

Contact plugs 80B are then formed over silicide regions 78. Also, contact plugs 80A (may also be referred to as gate contact plugs) are also formed in the recesses, and are over and contacting gate electrodes 68. The respective processes are illustrated as process 240 in the process flow 200 shown in FIG. 24. Contact plugs 80A and 80B may each comprise one or more layers, such as a barrier layer, a diffusion layer, and a filling material. For example, in accordance with some embodiments, contact plugs 80A and 80B each includes a barrier layer and a conductive material, and are electrically coupled to the underlying conductive feature (for example, gate stacks 70 or silicide region 78 in the illustrated embodiment). The barrier layer may include titanium, titanium nitride, tantalum, tantalum nitride, or the like. The conductive material may be copper, a copper alloy, silver, gold, tungsten, cobalt, aluminum, nickel, or the like. A planarization process, such as a CMP process, may be performed to remove excess material from a surface of ILD 76. Nano-FET 82 is thus formed.

Figure 22:
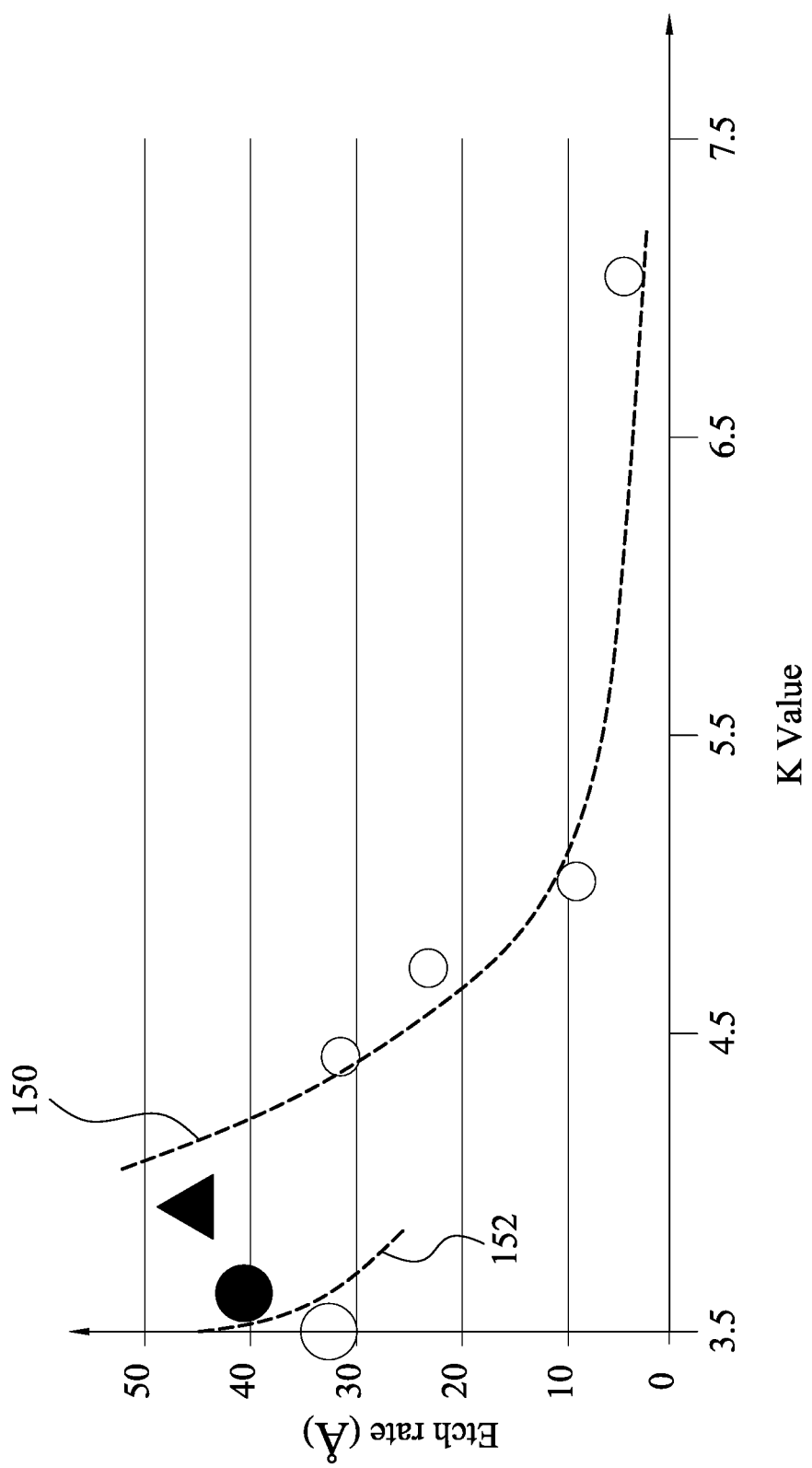
FIGS. 22 and 23 illustrate the etching rates of some dielectric materials as functions of k values in accordance with some embodiments.
Figure 23:
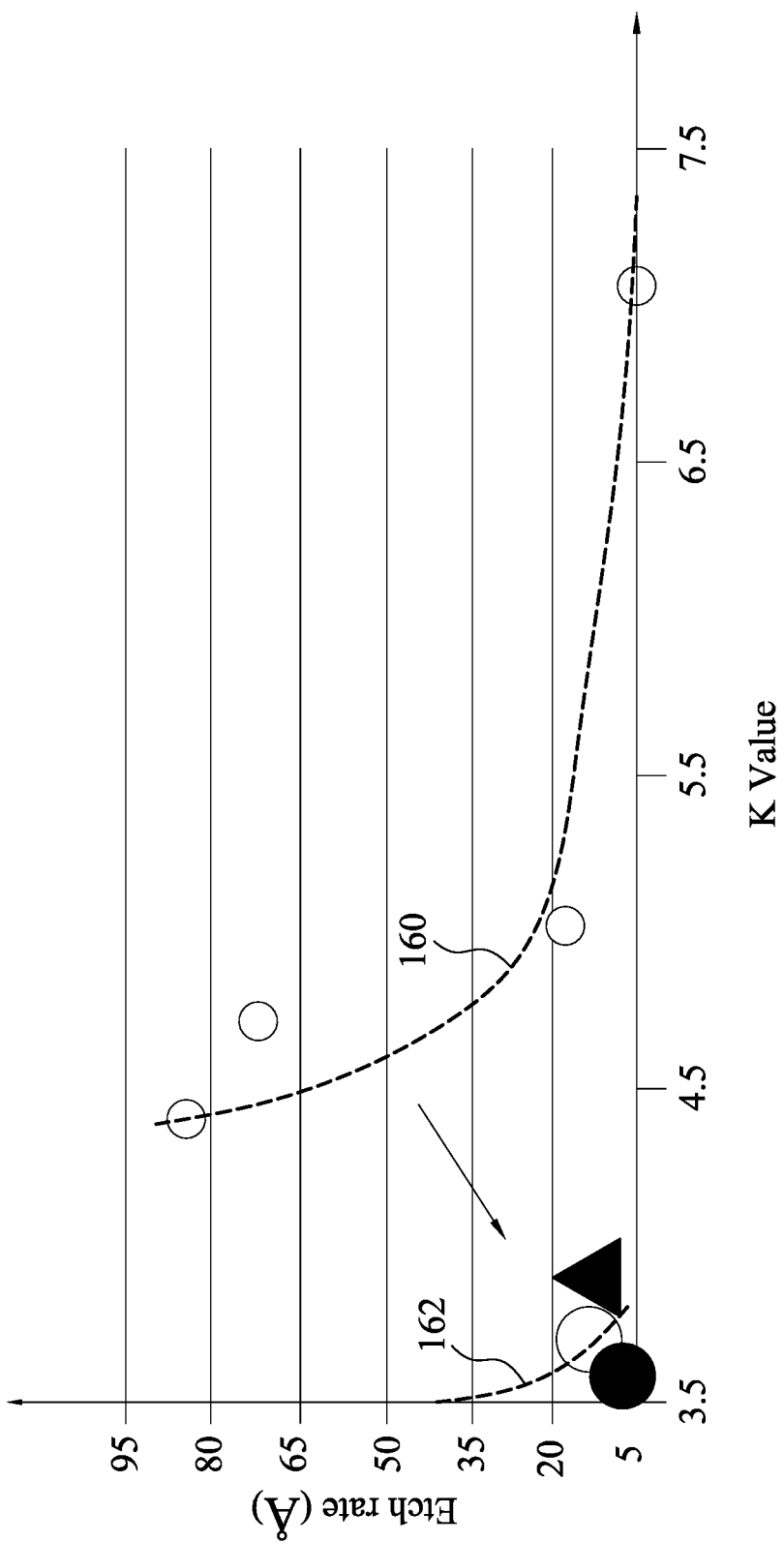

By forming dielectric films such as the inner spacers or gate spacers adopting the processes of the present disclosure, the dielectric films, although having reduced k values, remain to have desirable etching resistance. FIGS. 22 and 23 illustrate the etching rates of dielectric films as functions of k values. FIG. 22 illustrates the etching rates of the spacer layer 43 (FIG. 8B) during the spacer trimming and pre-clean processes as in the processes shown in FIG. 9B. Line 150 illustrates the etching rates of the dielectric materials (such as SiOCN, SiON, SiOC, SiCN) formed using conventional deposition processes. Line 152 illustrates the etching rates of the dielectric materials formed adopting the processes of the present disclosure. It is observed that comparing the dielectric materials represented by lines 150 and 152 having the same etching rates, the k value represented by line 152 has significantly lower k value than that of line 150. Alternatively stated, when two materials having the same k value are formed, with one formed using a conventional deposition process, and the other formed using a process of the present disclosure, the material formed using the process of the present disclosure has significantly lower etching rate, indicating higher etching resistance. It is to be noted that the reduced etching rates does not hurt the spacer trimming process since the process time may be prolonged.

FIG. 23 illustrates the etching rates of the spacer layer 43 (FIG. 8B) during the removal of sacrificial semiconductor layers 22A as in the process shown in FIG. 14B. Line 160 illustrates the etching rates of the dielectric materials (such as SiOCN, SiON, SiOC, SiCN) formed using conventional deposition processes. Line 162 illustrates the etching rates of the dielectric materials formed adopting the processes of the present disclosure. It is observed that comparing the dielectric materials represented by lines 160 and 162 having the same etching rates, the k value represented by line 162 has significantly lower k value than that of line 160. FIG. 23 also reveals that the dielectric films formed in accordance with the embodiments of the present disclosure have lower k values and higher etching resistance. In some experiments performed on the sample silicon wafers, a sample with the spacer layer 43 formed using conventional deposition process has a loss of 18.8 Å during the removal of sacrificial semiconductor layers 22A. As a comparison, three samples formed in accordance with the embodiments of the present disclosure have losses ranging from 8.4 Å to about 14.7 Å, all significantly less than the loss of the conventional material.

The embodiments of the present disclosure have some advantageous features. By forming dielectric films adopting the precursors and the film mature processes of the embodiments of the present disclosure, the k values of the dielectric films are reduced, and their etching resistance is improved.

In accordance with some embodiments of the present disclosure, a method comprises performing an ALD process to form a dielectric layer on a wafer, the ALD process comprises an ALD cycle comprising pulsing calypso $((SiCl_3)_2CH_2)$; purging the calypso; pulsing ammonia; and purging the ammonia; performing a wet anneal process on the dielectric layer; and performing a dry anneal process on the dielectric layer. In an embodiment, the method further comprises repeating the ALD cycle to increase a thickness of the dielectric layer. In an embodiment, the method further comprises forming a stack of layers comprising a plurality of semiconductor nanostructures; and a plurality of sacrificial layers, wherein the plurality of semiconductor nanostructures and the plurality of sacrificial layers are arranged alternatingly; laterally recessing the plurality of sacrificial layers to form lateral recesses, wherein the dielectric layer extends into the lateral recesses; and trimming the dielectric layer to remove portions of the dielectric layer outside of the recesses. In an embodiment, the method further comprises after the trimming, removing the plurality of sacrificial layers; and forming a gate stack extending into spaces left by the plurality of sacrificial layers. In an embodiment, the dielectric layer is formed on a gate stack of a transistor, and the method further comprising performing an anisotropic etching process to form a gate spacer from the dielectric layer. In an embodiment, the wet anneal process is performed using water steam. In an embodiment, the wet anneal process is performed at a first temperature, and the dry anneal process is performed at a second temperature higher than the first temperature. In an embodiment, the wet anneal process is performed at a first temperature in a range between about 300° C. and about 500° C., and the dry anneal process is performed at a second temperature in a range between about 400° C. and about 600° C. In an embodiment, the dry anneal process is performed using nitrogen $(N_2)$ as a process gas.

In accordance with some embodiments of the present disclosure, a method comprises forming a stack of layers comprising a first silicon layer and a second silicon layer; and a silicon germanium layer between the first silicon layer and the second silicon layer; laterally recessing the silicon germanium layer to form a lateral recess; depositing a dielectric layer, wherein the dielectric layer extends into the lateral recess; annealing the dielectric layer to reduce k values of the dielectric layer; trimming the dielectric layer to remove first portions of the dielectric layer outside of the lateral recesses, with second portions of the dielectric layer inside the recesses being left as inner spacers; removing the silicon germanium layer; and forming a gate stack extending into spacers between the first silicon layer and the second silicon layer. In an embodiment, the dielectric layer is deposited through an atomic layer deposition process, with calypso $((SiCl_3)_2CH_2)$ and ammonia being used as precursors. In an embodiment, the method further comprises, after depositing the dielectric layer, performing a wet anneal process and a dry anneal process on the dielectric layer. In an embodiment, the trimming the dielectric layer is performed after the wet anneal process and the dry anneal process are performed on the dielectric layer. In an embodiment, the trimming the dielectric layer is performed before the wet anneal process and the dry anneal process are performed on the dielectric layer. In an embodiment, the wet anneal process is performed at a first temperature, and the dry anneal process is performed at a second temperature higher than the first temperature.

In accordance with some embodiments of the present disclosure, a method comprises forming a stack of layers comprising a plurality of semiconductor nanostructures; and a plurality of sacrificial layers, wherein the plurality of semiconductor nanostructures and the plurality of sacrificial layers are arranged alternatingly; laterally recessing the plurality of sacrificial layers to form lateral recesses; and depositing a dielectric layer extending into the lateral recesses, wherein the dielectric layer is deposited using calypso (($SiCl_3$)$_2CH_2$) and ammonia as precursors. In an embodiment, the method further comprises annealing the dielectric layer. In an embodiment, the annealing comprises a wet anneal process and a dry anneal process. In an embodiment, the dielectric layer is deposited using atomic layer deposition. In an embodiment, the method further comprises removing the plurality of sacrificial layers; and forming a gate stack extending into spacers between the semiconductor nanostructures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    performing an atomic layer deposition (ALD) process to form a dielectric layer on a wafer, the ALD process comprises an ALD cycle comprising:
        pulsing calypso (($SiCl_3$)$_2CH_2$);
        purging the calypso;
        pulsing ammonia; and
        purging the ammonia;
    performing an oxidation process on the dielectric layer using oxygen ($O_2$) as a process gas; and
    after the oxidation process, performing a dry anneal process on the dielectric layer that has been oxidized in the oxidation process.

2. The method of claim 1 further comprising repeating the ALD cycle to increase a thickness of the dielectric layer.

3. The method of claim 1 further comprising:
    forming a stack of layers comprising:
        a plurality of semiconductor nanostructures; and
        a plurality of sacrificial layers, wherein the plurality of semiconductor nanostructures and the plurality of sacrificial layers are arranged alternatingly;
    laterally recessing the plurality of sacrificial layers to form lateral recesses, wherein the dielectric layer extends into the lateral recesses; and
    trimming the dielectric layer to remove portions of the dielectric layer outside of the recesses.

4. The method of claim 3 further comprising:
    after the trimming, removing the plurality of sacrificial layers; and
    forming a gate stack extending into spaces left by the plurality of sacrificial layers.

5. The method of claim 1, wherein the dielectric layer is formed on a gate stack of a transistor, and the method further comprising performing an anisotropic etching process to form a gate spacer from the dielectric layer.

6. The method of claim 1, wherein the oxidation process is performed at a lower temperature than the dry anneal process.

7. The method of claim 1, wherein the dry anneal process is performed at a temperature in a range between 400° C. and 600° C.

8. The method of claim 1, wherein the oxidation process is performed at a first temperature in a range between 300° C. and 500° C., and the dry anneal process is performed at a second temperature in a range between 400° C. and 600° C.

9. The method of claim 1, wherein the dry anneal process is performed using nitrogen ($N_2$) as a process gas.

10. A method comprising: forming a stack of layers comprising: a first silicon layer and a second silicon layer; and a silicon germanium layer between the first silicon layer and the second silicon layer; laterally recessing the silicon germanium layer to form a lateral recess; depositing a dielectric layer using calypso (($SiCl_3$)$_2CH_2$) and ammonia as precursors, wherein the dielectric layer extends into the lateral recess; performing an oxidation process on the dielectric layer using oxygen ($O_2$) as a process gas; after the oxidation process, annealing the dielectric layer to reduce k values of the dielectric layer, wherein the annealing comprises a dry anneal process, and wherein the dry anneal process is performed at a temperature in a range between 400° C. and 600° C. trimming the dielectric layer to remove first portions of the dielectric layer outside of the lateral recesses, with second portions of the dielectric layer inside the recesses being left as inner spacers; removing the silicon germanium layer; and forming a gate stack extending into spacers between the first silicon layer and the second silicon layer.

11. The method of claim 10, wherein the dielectric layer is deposited through an atomic layer deposition process, with calypso (($SiCl_3$)$_2CH_2$) and ammonia being conducted in a plurality of cycles.

12. The method of claim 11, wherein the dry anneal process is performed at a temperature higher than a temperature of the oxidation process.

13. The method of claim 12, wherein the trimming the dielectric layer is performed after the dry anneal process has been performed on the dielectric layer.

14. The method of claim 12, wherein the trimming the dielectric layer is performed before the oxidation process and the dry anneal process are performed on the dielectric layer.

15. The method of claim 12, wherein the oxidation process is performed at a first temperature, and the dry anneal process is performed at a second temperature higher than the first temperature.

16. A method comprising: forming a stack of layers comprising: a plurality of semiconductor nanostructures; and a plurality of sacrificial layers, wherein the plurality of semiconductor nanostructures and the plurality of sacrificial layers are arranged alternatingly; laterally recessing the plurality of sacrificial layers to form lateral recesses; depositing a dielectric layer extending into the lateral recesses, wherein the dielectric layer is deposited using with calypso $((SiCl_3)_2CH_2)$ and ammonia as precursors; and performing an oxidation process followed by a dry anneal process on the dielectric layer, wherein the dry anneal process is performed at a temperature in a range between 400"C and 600"C.

17. The method of claim 16, wherein after the oxidation process and the dry anneal process are performed, the dielectric layer is a low-k dielectric layer.

18. The method of claim 17, wherein the dry anneal process is performed using nitrogen $(N_2)$ as a process gas.

19. The method of claim 16, wherein the dielectric layer is deposited using atomic layer deposition.

20. The method of claim 16 further comprising:
   removing the plurality of sacrificial layers; and
   forming a gate stack extending into spacers between the semiconductor nanostructures.

* * * * *

UNITED STATES PATENT AND TRADEMARK OFFICE
CERTIFICATE OF CORRECTION

PATENT NO. : 12,206,012 B2
APPLICATION NO. : 17/333592
DATED : January 21, 2025
INVENTOR(S) : Wen-Kai Lin et al.

Page 1 of 1

It is certified that error appears in the above-identified patent and that said Letters Patent is hereby corrected as shown below:

In the Claims

In Column 17, Line 5, Claim No. 16:
Change "at a temperature in a range between 400"C and 600"C."
To --at a temperature in a range between 400° C. and 600° C.--

Signed and Sealed this
Fourth Day of March, 2025

Coke Morgan Stewart
*Acting Director of the United States Patent and Trademark Office*